(12) United States Patent  
Tsuchi

(10) Patent No.: US 7,368,990 B2  
(45) Date of Patent: May 6, 2008

(54) DIFFERENTIAL AMPLIFIER AND DATA DRIVER EMPLOYING THE DIFFERENTIAL AMPLIFIER

(75) Inventor: Hiroshi Tsuchi, Tokyo (JP)

(73) Assignees: NEC Corporation (JP); NEC Electronics Corporation (JP)

( * ) Notice: Subject to any disclaimer, the term of this patent is extended or adjusted under 35 U.S.C. 154(b) by 235 days.

(21) Appl. No.: 11/304,599

(22) Filed: Dec. 16, 2005

(65) Prior Publication Data

US 2006/0132193 A1    Jun. 22, 2006

(30) Foreign Application Priority Data

Dec. 16, 2004    (JP)    ............................. 2004-364954

(51) Int. Cl.
*H03F 3/45* (2006.01)
(52) U.S. Cl. ...................... 330/261; 330/301; 330/275; 330/257; 330/253; 341/145
(58) Field of Classification Search ................ 330/261, 330/301, 275, 257, 253
See application file for complete search history.

(56) References Cited

U.S. PATENT DOCUMENTS

| | | | |
|---|---|---|---|
| 5,130,666 A * | 7/1992 | Nicollini ...................... | 330/253 |
| 5,396,245 A | 3/1995 | Rempfer | |
| 6,140,872 A * | 10/2000 | McEldowney ................ | 330/9 |
| 6,246,351 B1 | 6/2001 | Yilmaz | |
| 6,727,759 B2 * | 4/2004 | Nguyen et al. ............. | 330/279 |
| 7,167,049 B2 * | 1/2007 | Lim ........................... | 330/253 |
| 2006/0139101 A1 * | 6/2006 | Saitoh ........................ | 330/307 |
| 2007/0159250 A1 * | 7/2007 | Tsuchi et al. ............... | 330/253 |

FOREIGN PATENT DOCUMENTS

JP        P2001-34234 A        2/2001

* cited by examiner

*Primary Examiner*—Patricia Nguyen
(74) *Attorney, Agent, or Firm*—Dickstein, Shapiro, LLP.

(57) ABSTRACT

Disclosed is a differential amplifier which includes first and second input terminals, an output terminal, first and second differential pairs, and first and second current sources for supplying currents to the first and second differential pairs. The first differential pair has first and second inputs of an input pair connected to the first input terminal and the output terminal, respectively. The second differential pair has first and second inputs of an input pair connected to the second input terminal the output terminal, respectively. The differential amplifier further includes a load circuit connected to output pairs of the first and second differential pairs for outputting a signal obtained on combining outputs of the first and second differential pairs from at least one of a pair of connection nodes between the output pairs of the first and second differential pairs and the load circuit, an amplifier stage supplied with at least one signal at a connection node of the output pairs of the first and second differential pairs and the load circuit to output a voltage at the output terminal, and a current control circuit controlling the first and second current sources for controlling the ratio of currents supplied to the first and second differential pairs.

11 Claims, 20 Drawing Sheets

FIG. 8

| LEVEL | INPUT | (T1,T2) | (D2,D1,D0) |
|---|---|---|---|
| 1 | A | AA | 0,0,0 |
| 2 |   | AB | 0,0,1 |
| 3 | B | BB | 0,1,0 |
| 4 |   | AC | 0,1,1 |
| 5 |   | BC,(AD) | 1,0,0 |
| 6 |   | BD | 1,0,1 |
| 7 | C | CC | 1,1,0 |
| 8 |   | CD | 1,1,1 |
| 9 | D | DD |   |

*ORDER IS ARBITRARY OF T1, T2

FIG. 9

| LEVEL | INPUT | (T1,T2) | (D3,D2,D1,D0) |
|---|---|---|---|
| 1 | A | AA | 0,0,0,0 |
| 2 |   | AB | 0,0,0,1 |
| 3 | B | BB | 0,0,1,0 |
| 4 |   | AC | 0,0,1,1 |
| 5 |   | BC | 0,1,0,0 |
| 6 |   | AD | 0,1,0,1 |
| 7 | C | CC,(BD) | 0,1,1,0 |
| 8 |   | AE | 0,1,1,1 |
| 9 |   | CD,(BE,AF) | 1,0,0,0 |
| 10 |   | BF | 1,0,0,1 |
| 11 | D | DD,(CE) | 1,0,1,0 |
| 12 |   | CF | 1,0,1,1 |
| 13 |   | DE | 1,1,0,0 |
| 14 |   | DF | 1,1,0,1 |
| 15 | E | EE | 1,1,1,0 |
| 16 |   | EF | 1,1,1,1 |
| 17 | F | FF |   |

*ORDER IS ARBITRARY OF T1, T2

DIFFERENTIAL AMPLIFIER AND DATA DRIVER EMPLOYING THE DIFFERENTIAL AMPLIFIER

FIELD OF THE INVENTION

This invention relates to a differential amplifier, a display apparatus employing the differential amplifier.

BACKGROUND OF THE INVENTION

Recently, a liquid crystal display (LCD) apparatus, featuring thin thickness, small weight and low power usage, has come into widespread use, as display apparatus, and is used predominantly in a display section of a mobile device, such as mobile phone or cellular phone, PDA (Personal Digital Assistant) or a notebook PC. However, of these days, the technique for forming a liquid crystal display to a large size or for coping with moving pictures has been improved such that realization of a large size display apparatus of a mobile type but also of a desktop type, or a large size liquid crystal television receiver, has become feasible. For liquid crystal display apparatus, a liquid crystal display apparatus of the active matrix driving system, capable of high definition demonstration, is currently in use. Referring first to FIG. 15, a typical structure of the liquid crystal display apparatus of the active matrix driving system is schematically described. Meanwhile, FIG. 15 schematically shows, by an equivalent circuit, an essential structure centered about the connection portion to a single pixel in a liquid crystal display section.

In general, a display 960 of a liquid crystal display apparatus of the active matrix driving system comprises a semiconductor substrate which includes a matrix array of transparent pixel electrodes 964 and thin film transistors (TFTs) 963 (an array of 1280 columns each composed of three pixels and 1024 pixel rows in the case of a color SXGA panel), a opposing substrate, in which a transparent electrode 966 is provided over its entire surface, and a liquid crystal material which is enclosed in a space defined between the semiconductor substrate and the opposing substrate which are mounted facing each other.

The TFTs, having the switching function, are controlled by scanning signals. When the TFTs are turned on, the gray scale voltage, corresponding to a picture signal, is applied to pixel electrode 964. The liquid crystal is changed in transmittance by the potential difference between the pixel electrode 964 and the opposing electrode 966. The potential difference is retained for a predetermined time by a liquid crystal capacitance 965 to display a picture.

On the semiconductor substrate, data lines 962 for delivering plural level voltages (gray scale voltage) to be applied to the respective pixel electrodes 964 and scanning lines 961 for sending scanning signals are arrayed in a lattice configuration. The numbers of the data lines and the scanning lines are 1280×3 and 1024, respectively, for the case of the above color SXGA panel. The scanning lines 961 and the data lines 962 represent large capacitive load due e.g. to the capacitance generated in the intersections and to the liquid crystal capacitance sandwiched between the two facing substrates.

Meanwhile, the scanning signal is supplied by a gate driver 970 to the scanning line 961, while the gray scale voltage is supplied from a data driver 980 to the pixel electrodes 964 over a data line 962.

Data is written from one frame to another within one frame period (1/60 sec), that is, data is selected from one pixel row to another, viz. from one scanning line to another, and the gray scale voltage is supplied from each data line during the select period.

While it is only necessary for the gate driver 970 to supply at least binary scanning signal, it is necessary for the data driver 980 to drive the data lines with the gray scale voltage of multiple levels corresponding to the number of gray levels. For this reason, a differential amplifier capable of outputting a high precision voltage is used as a buffer unit of the data driver 980.

Recently, with the tendency towards high picture quality (i.e. towards multiple colors), there is an increasing demand for at least 260000 colors (picture data of 6 bits for each of RGB) and for as many as 26800000 colors (picture data of 8 bits for each of RGB).

Hence, the data driver, outputting the gray scale voltage relating to multi-bit picture data, is required to output the voltages to extremely high accuracy. Moreover, the number of devices of the circuitry processing the picture data is increased, thus leading to an increased chip area of the data driver LSI and to increased cost. This problem will now be discussed in detail.

FIG. 16 is a diagram illustrating the configuration of the data driver 980 of FIG. 15 and, more precisely, shows a block diagram showing essential parts of the data driver 980. Referring to FIG. 16, the data driver 980 comprises a latch address selector 981, a latch 982, a gray scale voltage generating circuit 983, a plural number of decoders 984, and a plural number of buffer circuits 985.

The latch address selector 981 determines the data latch timing, based on a clock signal CLK. At a timing as determined by the latch address selector 981, the latch 982 latches digital picture data and, responsive to an STB signal (strobe signal), unanimously outputs the latched data to the respective decoders 984. The gray scale voltage generating circuit 983 generates a number of gray scale voltages related to the picture data. The decoder 984 selects and outputs one of the gray scale voltages corresponding to the input data. The buffer circuit 985 is supplied with the gray scale voltage output from the decoder 984 to amplify the current to issue an output voltage Vout.

For example, in case of 6-bit picture data being input, the number of gray levels is 64, with the gray scale voltage generating circuit 983 generating 64-level gray scale voltages. The decoder 984 includes a circuit for selecting one gray scale voltage from the 64 level gray scale voltages.

For example, in case of 8-bit picture data being input, the number of gray levels is 256, with the gray scale voltage generating circuit 983 generating 256-level gray scale voltages. The decoder 984 includes a circuit for selecting one gray scale voltage from the 256 level gray scale voltages.

With increase in the number of bits, the gray scale voltage generating circuit 983 or the decoder 984 is increased in circuit scale. For example if the number of bits is increased from 6 to 8, the circuit scale is increased by a factor not less than four. Thus, with increase in the number of bits, the chip area of the data driver LSI is increased to raise the cost.

There is described in Patent Document 1, specified below, a structure for suppressing the chip area of the data driver LSI from increasing, despite increase in the number of bits. An illustrative structure as proposed in the Patent Document 1 is shown in FIG. 17, corresponding to FIG. 16 of the Patent Document 1.

Referring to FIG. 17, this data driver differs from the data driver shown in FIG. 16 as to the structure of a gray scale voltage generating circuit 986, a decoder 987 and a buffer circuit 988. In the data driver, shown in FIG. 17, the gray scale voltage generating circuit 986 generates the gray scale voltage, every two gray levels, to decrease the number of gray level voltage lines of the decoder 987 to approximately one-half that of the decoder 984 of FIG. 16. The decoder 987 selects two gray level voltages, depending on picture data, to send out the selected voltages to the buffer circuit 988, which buffer circuit then is able to apply current amplification to the two gray level voltages and a gray level voltage intermediate between these two gradation voltages to output the resulting voltage.

In the configuration disclosed in the Patent Document 1, provided with the buffer circuit 988, supplied with two gray scale voltages to selectively output one of the two gray scale voltages and the voltage intermediate between the two gradation voltages, it is contemplated to reduce the number of the gray scale voltage lines of the decoder 987 and hence the circuit scale of the decoder 987 to save the floor and hence the production cost.

In Patent Documents 2 and 3, as specified below, there is described a structure for significantly saving the data recording area of a circuit for converting multi-bit digital signals into analog signals (digital-to-analog converter, abbreviated to DAC), as an interpolation DAC. The technique disclosed in Patent Document 3 is an improvement over that of the Patent Document 2 and is relevant to the configuration for improving the performance of output voltage accuracy. In the following, the Patent Document 3 is described. Referring to FIG. 18, this DAC is made up by a resistor string, outputting n analog voltages from its respective taps, a first group of switches, made up of n switches of from S1a to Sna, for selecting one voltage V1 from each tap, a second group of switches, made up of n switches of from S1b to Snb, for selecting a voltage V2, neighboring to this voltage V1, a third group of switches, made up of switches SW1, SW2 and SW3, for selecting one of V1 and V2, and an amplifier 200, made up of four differential pairs (Q0A, Q0B), (Q1A, Q1B), (Q2A, Q2B), and (Q3A, Q3B) which are driven by distinct current sources. The output pairs of the four differential pairs are connected in common to input/output pairs of the current mirror circuit (QL1, QL2), while output signals of the four differential pairs are differentially output to a differential amplifier 205, which issues an output voltage Vout at its output terminal. One of inputs of input pairs of the four differential pairs (Q0A, Q0B), (Q1A, Q1B), (Q2A, Q2B), and (Q3A, Q3B) is connected to an output terminal in a feedback configuration. As for the other inputs of the input pairs of the four differential pairs (Q0A, Q0B), (Q1A, Q1B), (Q2A, Q2B), and (Q3A, Q3B), one is connected to the first group of the switches, selecting the voltage V1, with the remaining three being connected to the third group of switches SW1, SW2 and SW3 adapted for selecting one of V1 and V2. Turning to the operation of the DAC, the K'th switches (Ska and Skb) of the first and second group of switches (S1a . . . Sna), (S1b . . . Snb) are turned on by an output of an MSB (Most Significant Bit) subword decoder, based on upper order bit signals of the input data, to select voltages of neighboring taps as V1 and V2, and further the switching of the switches of the third group of switches (SW1, SW2, SW3) is controlled by an output of an LSB (Least Significant Bit) subword decoder, based on lower bit signals of the input data.

By the selecting conditions of the third group of switches (SW1, SW2, SW3), four level voltages Vo1 to Vo4, corresponding to interior division of the voltages V1 and V2, shown in FIG. 19 at different interior division ratios, are output. Specifically, If the three switches SW1, SW2, SW3 of the third group of switches all select the voltage V1, Vo1 equal to the voltage V1 is output.

If two of the three switches SW1, SW2, SW3 select the voltage V1 and the remaining one selects the voltage V2, Vo2 is output.

If one of the three switches selects the voltage V1 and the remaining two select the voltage V2, Vo3 is output.

If all of the three switches select the voltage V2, Vo4 is output.

If the four level voltages Vo1 to Vo4 are to be output linearly to a high voltage accuracy, it is necessary that the four differential pairs (Q0A, Q0B), (Q1A, Q1B), (Q2A, Q2B), and (Q3A, Q3B) are made up of transistors of the same size, and that the current of the current sources for driving the differential pairs, is controlled to a constant value. By this configuration and switch control, described above, the DAC of FIG. 18 is able to output a sum total of 4n level voltages by the MSB and LSB subwords.

By applying the principle of this DAC to the gray scale voltage generating circuit 983, decoders 984 and to the buffer circuits 985 of FIG. 16, it becomes possible to reduce significantly the number of gray scale voltages output from the gray scale voltage generating circuit 983, to reduce the number of devices for selecting the gray scale voltage and to reduce the circuit scale significantly.

[Patent Document 1]
Japanese Patent Kokai Publication No. JP-P2001-34234 (FIG. 16)

[Patent Document 2]
U.S. Pat. No. 5,396,245 (FIG. 5)

[Patent Document 3]
U.S. Pat. No. 6,246,351 (FIG. 2)

SUMMARY OF THE DISCLOSURE

Meanwhile, with the DAC shown in FIG. 18, the two voltages V1 and V2 can be divided by different interior division ratios, by the amplifier 200, having four differential pairs, to output four levels. The number of levels, excluding the two voltages V1 and V2, is three.

That is, if, in the principle of the DAC, shown in FIG. 18, a levels excluding the two voltages V1 and V2 are to be output, it is necessary to provide (a+1) differential pairs and current sources driving them. Hence, the larger the number of levels interiorly dividing the two voltages V1 and V2, the larger becomes the number of amplifier devices 200 and the larger becomes the circuit size.

Accordingly, it is therefore an object of the present invention to provide an area saving differential amplifier with which it is possible to increase the number of levels interiorly dividing the two voltages without increasing the number of the differential pairs.

It is a further object of the present invention to provide a data driver of a display apparatus in which the circuit scale of the gray level voltage generating circuit, decoder and the amplifier may significantly be reduced by employing the aforementioned differential amplifier.

It is yet another object of the present invention to provide a display apparatus of low production cost through use of the above data driver.

The above and other objects are attained by a differential amplifier in accordance with one aspect of the present invention, which comprises first and second input terminals;

an output terminal;

first and second differential pairs;

first and second current sources for supplying currents to said first and second differential pairs, respectively;

said first differential pair having first and second inputs constituting an input pair thereof connected to said first input terminal and said output terminal, respectively;

said second differential pair having first and second inputs constituting an input pair thereof connected to said second input terminal and said output terminal, respectively;

a load circuit connected to output pairs of said first and second differential pairs, for outputting a signal obtained on combining outputs of said first and second differential pairs from at least one of respective connection node between the output pairs of said first and second differential pairs and said load circuit;

an amplifier stage for receiving at least one signal at a connection node between said output pairs of said first and second differential pairs and said load circuit and for outputting a voltage at said output terminal; and a current control circuit for controlling said first and second current sources to control the ratio of currents supplied to said first and second differential pairs, respectively.

Preferably, in the differential amplifier according to the present invention, the load circuit is formed by a current mirror circuit.

Preferably, the differential amplifier according to the present invention comprises: first and second voltage supply terminals for receiving preset voltages; and an input control circuit for controlling the connection between said first and second voltage supply terminals and said first and second input terminals.

Preferably, in the differential amplifier according to the present invention, the first and second current sources each include a transistor. The current control circuit selects a bias voltage, out of a plurality of bias voltages supplied, based on an input control signal, and sends the selected bias voltage to control terminals of the transistors constituting the first and second current sources to control the ratio of the currents to be supplied to the first and second differential pairs.

Preferably, in the differential amplifier according to the present invention, the current control circuit controls the first and second current sources so that the sum of the currents supplied to the first and second differential pairs will be constant.

Preferably, in the differential amplifier according to the present invention, said first and second differential pairs are formed so that the transistors of the same pair are of the same transistor characteristic.

Preferably, in the differential amplifier according to the present invention, the transistor pairs of said first and second differential pairs are of the same size, the ratio of the currents through said first and second differential pairs is adjusted, and a voltage corresponding to one of levels which divide the potential difference between said first and second input terminals by three is output from said output terminal.

Preferably, in the differential amplifier according to the present invention, the currents of said first and second current sources differ from each other; and first and second voltages are applied to said first and second input terminals, respectively.

A first voltage level, corresponding to said first voltage, is output from said output terminal, under interruption of the current of said second current source, a second voltage level, corresponding to one of voltage levels which divide the potential difference between said first and second voltages by three, is output from said output terminal, with the current of said first current source being larger than the current of said second current source, a third voltage level, corresponding to the other of voltage levels which divide the potential difference between said first and second voltages by three, is output from said output terminal, with the current of said second current source being larger than the current of said first current source, and a fourth voltage level, corresponding to said second voltage, is output from said output terminal, under interruption of the current of said first current source.

A differential amplifier in accordance with another aspect of the present invention comprises:

first and second input terminals;

an output terminal;

first and second differential pairs of the first conductivity type having first inputs constituting respective input pairs thereof connected to said first and second input terminals, respectively and having second inputs constituting respective the input pairs thereof connected to said output terminal;

first and second current sources for supplying the current to said first and second differential pairs, respectively;

a first load circuit connected to output pairs of said first and second differential pairs;

third and fourth differential pairs of the second conductivity type, having first inputs constituting respective input pairs thereof connected to said first and second input terminals, respectively and having second inputs constituting the respective input pairs thereof connected to said output terminal;

third and fourth current sources supplying the current to said third and fourth differential pairs, respectively;

a second load circuit connected to output pairs of said third and fourth differential pairs;

at least one output of an output pair of said first differential pair and one output of an output pair of said second differential pair being connected in common;

a first amplifier stage having an input terminal connected to a common connection node between one output of an output pair of the first differential pair, and one output of an output pair of the second differential pair and having an output terminal connected to said output terminal;

at least one output of an output pair of said third differential pair and one output of an output pair of said fourth differential pair being connected in common;

a second amplifier stage having an input terminal connected to a common connection node between one output of an output pair of the third differential pair and one output of an output pair of the fourth differential pair and having an output terminal connected to said output terminal;

a first current control circuit for controlling said first and second current sources to control the ratio of currents supplied to said first and second differential pairs; and a second current control circuit for controlling said third and fourth current sources to control the ratio of currents supplied to said third and fourth differential pairs.

Preferably, in the differential amplifier according to the present invention, each of said first to fourth current sources includes a transistor; said first current control circuit is supplied with a plurality of bias voltages and selects a bias voltage based on an input control signal to supply the selected bias voltage to control terminals of transistors constituting said first and second current sources to control the current ratio of the currents supplied to said first and second current sources;

said second current control circuit is supplied with a plurality of bias voltages and selects a bias voltage based on an input control signal to supply the selected bias voltage to control terminals of transistors constituting said third and fourth current sources to control the current ratio of the currents supplied to said third and fourth current sources.

A differential amplifier in accordance with a further aspect of the present invention, comprises first and second input terminals;
an output terminal;
first and second differential pairs having at least two transistor characteristics different from each other; and
first and second current sources for supplying the currents to said first and second differential pairs, respectively;
said first differential pair having first and second inputs constituting an input pair thereof connected to said first input terminal and said output terminal, respectively;
said second differential pair having first and second inputs constituting an input pair thereof connected to said second input terminal and said output terminal;
a load circuit connected to output pairs of said first and second differential pairs, for outputting a signal obtained on combining outputs of said first and second differential pairs from at least one of a pair of connection nodes between said output pairs of said first and second differential pairs and said load circuit; and
an amplifier stage supplied with at least one signal at a connection node between said output pairs of said first and second differential pairs and said load circuit to output a voltage to said output terminal.

Preferably, the differential amplifier according to the present invention, may further comprise two voltage supply terminals for receiving first and second voltages, respectively, and an input control circuit for controlling the connection or non-connection of the two voltage supply terminals and the first and second input terminals.

Preferably, in the differential amplifier according to the present invention, the characteristics of the transistor pairs of said first and second differential pairs are set to be different each other, and the connection between the two voltage supply terminals and the first and second input terminals being controlled by the input control circuit, and a voltage corresponding to one of voltage levels which divide the potential difference between said first and second input terminals is output from said output terminal by three.

Preferably, in the differential amplifier according to the present invention, the W/L ratio (ratio of the channel width W to the channel length L) of the transistor pairs of said first differential pairs are larger than that of said second differential pairs, and the first and second voltages are selectively applied to said first and second input terminals.

A first voltage level, corresponding to said first voltage is output from said output terminal, with said first and second input terminals both being at a first voltage, a second voltage level corresponding to one of voltage levels which divide the potential difference between said first and second voltages by three, is output from said output terminal, with said first and second input terminals being at first and second voltages, respectively, a third voltage level corresponding to one of voltage levels which divide the potential difference between said first and second voltages by three, is output from said output terminal, with said first and second input terminals being at second and first voltages, respectively, and a fourth voltage level corresponding to said second level is output from said output terminal, with said first and second input terminals both being at said second voltage.

A differential amplifier in accordance with further aspect of the present invention comprises first and second input terminals;
an output terminal;
first and second differential pairs;
first and second current sources for supplying the current to said first and second differential pairs;
said first differential pair having first and second inputs constituting an input pair thereof connected to said first input terminal and said output terminal, respectively;
said second differential pair having first and second inputs constituting an input pair thereof connected to said second input terminal and said output terminal, respectively;
a load circuit connected to output pairs of said first and second differential pairs, for outputting a signal obtained on combining outputs of said first and second differential pairs from at least one of a pair of connection nodes between said output pairs of said first and second differential pairs and said load circuit;
an amplifier stage supplied with at least one signal at connection nodes of said output pairs of said first and second differential pairs and said load circuit to output a voltage to said output terminal; and
a selection circuit supplied with a plurality of voltages different from one another, for selecting, from among said voltages different from one another, two voltages, including the same voltage, based on a selection control signal, to supply the selected two voltages to said first and second input terminals;
one output voltage being output for a combination of said two voltages selected by said selection circuit.

Preferably, in the differential amplifier according to the present invention, said selection circuit is supplied with first to fourth voltages (A to D) having voltage values different from one another and sends any of paired voltages:

(1) first and first voltages (A, A),
(2) first and second voltages (A, B),
(3) second and second voltages (B, B),
(4) first and third voltages (A, C),
(5) second and third voltages (B, C) or first and fourth voltages (A, D)
(6) second and fourth voltages (B, D),
(7) third and third voltages (C, C),
(8) third and fourth voltages (C, D) and
(9) fourth and fourth voltages (D, D)

to said first and second input terminals.

said differential amplifier is able to output nine at the maximum of voltages different from one another from said output terminal.

Preferably, in the differential amplifier according to the present invention, the first, third, seventh and ninth voltage levels from among nine voltage levels, are supplied as said first to fourth voltage levels.

Preferably, in the differential amplifier according to the present invention, said selection circuit is supplied with first to sixth voltages (A to F) having voltage values different from one another, and sends any of paired voltages:

(1) first and first voltages (A, A),
(2) first and second voltages (A, B),
(3) second and second voltages (B, B),
(4) first and third voltages (A, C),
(5) second and third voltages (B, C)
(6) first and fourth voltages (A, D),
(7) third and third voltages (C, C) or second and fourth voltages (B, D)
(8) first and fifth voltages (A, E), (9) third and fourth voltages (C, D) or second and fifth voltages (B, E) or first and sixth voltages (A, F),

(10) second and sixth voltages-(B, F)

(11) fourth and fourth voltages (D, D) or third and fifth voltages (C, E)

(12) third and sixth voltages (C, F)

(13) fourth and fifth voltages (D, E)

(14) fourth and sixth voltages (D, F)

(15) fifth and fifth voltages (E, E)

(16) fifth and sixth voltages (E, F)

(17) sixth and sixth voltages (F, F)

to said first and second input terminals.

said differential amplifier is able to output 17 at the maximum of voltages different from one another from said output terminal.

Preferably, in the differential amplifier according to the present invention, first, third, seventh, eleventh, fifteenth and seventeenth voltage levels from among 17 voltage levels are supplied as said first to sixth voltages.

Preferably, in the differential amplifier according to the present invention, when m voltages, different from one another, m being a multiple of 8 plus 1, are output, the number of voltages, supplied as input voltages, is [{(m−1)/4}+2]. Two voltages, inclusive of overlapping values (the same voltage value), may be selected from among the [{(m−1)/4}+2] voltages, and the so selected two voltages are sent to the first and second terminals. The differential amplifier is able to output m voltage levels at the output terminal. For the first to m'th voltage levels output, the voltages supplied as input voltages may include first, (3+4×k)'th and the m'th voltage levels, k being an integer of 0, 1, . . . , (m−5)/4, against the first to m'th output voltage levels.

Preferably, in the differential amplifier according to the present invention, said amplifier stage includes a transistor connected between a power supply and said output terminal and adapted for charging/discharging said output terminal.

Preferably, in the differential amplifier according to the present invention, at least one of said first and second amplifier stages includes a transistor connected between a power supply and said output terminal and adapted for charging/discharging said output terminal.

A digital-to-analog converter according another aspect of the present invention comprises:

a resistor string connected between said first voltage supply terminal and a second voltage supply terminal and outputting a plurality of voltage levels different from one another from respective taps thereof; and a switching circuit for selectively outputting two voltages, based on input data, from among a plurality of voltage levels, different from one another, output from respective taps of said resistor string; and the differential amplifier according to the present invention, as an amplifier circuit supplied with the two voltages output from said switch circuit and outputting a voltage relating to said input data.

A digital-to-analog converter according another aspect of the present invention comprises:

a resistor string connected between a first voltage supply terminal and a second voltage supply terminal and outputting a plurality of voltage levels different from one another from respective taps thereof; and a switching circuit for selectively outputting two voltages, inclusive of the same voltages, based on input data, from among a plurality of voltage levels, different from one another, output from respective taps of said resistor string; and the differential amplifier according to the present invention, as an amplifier circuit supplied with the two voltages output from said switch circuit and outputting a voltage relating to said input data.

In another aspect, the present invention provides a data driver for a display apparatus comprising a gray level voltage generating circuit generating a plurality of voltage levels, a decoder outputting at least two voltages selected from the plural voltages, based on input data, and a differential amplifier, described above, as an amplifier circuit supplied with the voltage output from the decoder and outputting a voltage relating to the input data at an output terminal.

In yet another aspect, the present invention provides a controlling method for enabling m voltage levels to be output, m being such that m=8×l+1. l being a positive integer, using a differential amplifier, said differential amplifier including at least two differential pairs, each having a non-inverting input terminal supplied with a signal voltage and having an inverting input terminal connected in common to an output terminal, each non-inverting input terminal being supplied with first and second voltages, inclusive of the same voltage values, said differential amplifier outputting said first and second voltages and a voltage which is a division of said first and second voltages; said method comprising: the steps of generating at least [{(m−1)/4+2}] voltage levels, composed of first, 3+4×k'th, k being an integer of 0, 1, . . . , (m−5)/4, and m'th voltage levels, for the first to the m'th voltage levels;

selecting two voltages, inclusive of the voltage values, from among [{(m−1)/4+2}] voltages supplied as input voltages; and supplying the two voltages selected to at least said non-inverting input terminal of said two differential pairs.

The meritorious effects of the present invention are summarized as follows.

The present invention gives rise to a meritorious effect that, in a differential amplifier having two differentia pairs of the same polarity type, two input voltages and two or more level voltages, interiorly dividing the interval of the two input voltages, may be output responsive to the two input voltages.

The present invention also gives rise to a meritorious effect that a differential amplifier capable of outputting three voltage levels, namely two input voltages and an intermediate voltage, responsive to the two input voltages, may be realized, in which, by supplying, as two input voltages, two preset combinatorial voltages, including the same voltage, from among n voltages, n being a positive natural number not less than 3, it is possible to output substantially equally spaced apart (2n+1) or more level voltages.

The present invention also gives rise to a meritorious effect that, by employing, in an output buffer unit of a data driver of a display apparatus, a differential amplifier having two differentia pairs of the same polarity type, in which two input voltages and two or more level voltages, interiorly dividing the interval of the two input voltages, may be output responsive to the two input voltages, it is possible to reduce the number of gray level voltages generated in the gray level voltage generating circuit to reduce the circuit scale of the decoder and the output buffer unit to save the data drive area and hence the production cost.

The present invention also gives rise to a meritorious effect that, by employing, in an output buffer unit of a data driver of a display apparatus, a differential amplifier capable of outputting three voltage levels, namely two input voltages and an intermediate voltage, responsive to the two input voltages, in which, by supplying, as two input voltages, two preset combinatorial voltages, including the same voltage, from among n voltages, n being a positive natural number not less than 3, substantially equally spaced apart (2n+1) or more level voltages may be output, it is possible to reduce the number of gray level voltages generated in the gray level voltage generating circuit to reduce the circuit scale of the decoder and the output buffer unit to save the data driver area and hence the production cost.

Moreover, the present invention also gives rise to a meritorious effect that, by employing the data driver, reduced in area, for a display apparatus, the display apparatus may be lowered in cost and the framing area of the display apparatus may also be decreased.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 8 shows an exemplary method for selecting a bi-level input voltage according to the fourth embodiment of the present invention.

FIG. 9 shows another exemplary method for selecting a bi-level input voltage according to the fourth embodiment of the present invention.

FIG. 19 illustrates how the input/output level in FIG. 19 is coped with.

PREFERRED EMBODIMENTS OF THE INVENTION

Figure 1:
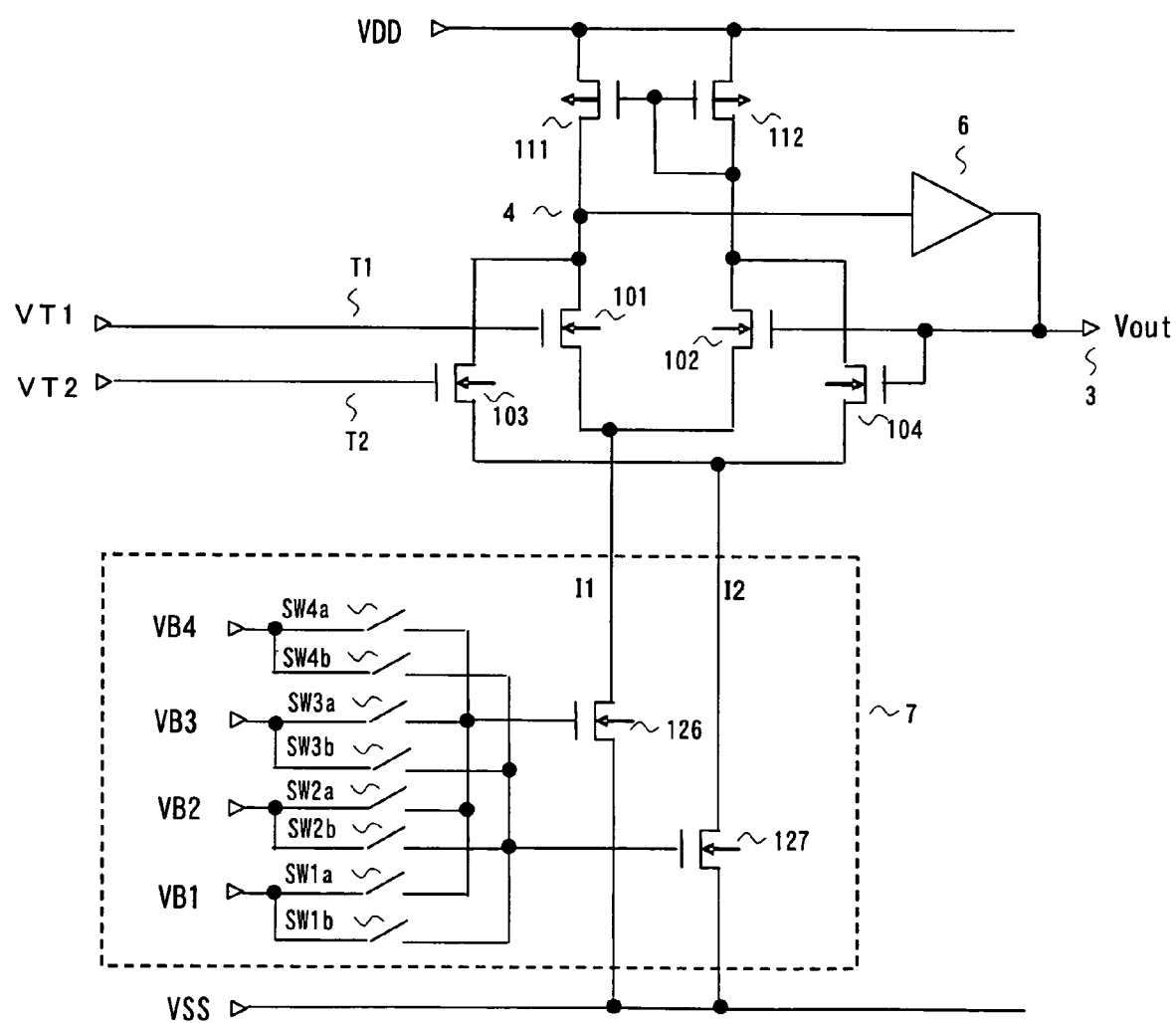
FIG. 1 is a diagram illustrating the configuration of a differential amplifier according to a first embodiment of the present invention.

The present invention will be described in more detail with reference to the drawings. FIG. 1 is a diagram illustrating the configuration of a differential amplifier according to a first embodiment of the present invention. Referring to FIG. 1, the differential amplifier according to the first embodiment of the present invention includes a first differential pair (101, 102), a second differential pair (103, 104), a current mirror circuit (111, 112), which is connected to output pairs of the first and second differential pairs and composes a common active load for the first and second differential pairs, an amplifier circuit 6, which is supplied with an output signal of the current mirror circuit (111, 112) and outputs a voltage Vout at an output terminal 3, and a current control circuit 7 which is for controlling respective currents (I1, I2) which flow through the first and second differential pairs. It is noted that the differential pair, which is constituted by a pair of transistors (101, 102), is referred to below as a differential pair (101, 102).

The transistor 101 of the first differential pair has a control terminal (gate) connected to an input terminal T1, and the transistor 103 of the second differential pair has a control terminal (gate) connected to an input terminal T2. The control terminals of the transistors 102 and 104 of the first and second differential pairs are connected to an output terminal 3, with an output voltage Vout being fed back to an input side. The terminal voltages of the input terminals T1 and T2 are designated as VT1 and VT2, respectively.

The current control circuit 7 comprises a current control transistor 126, which is connected to a low potential power supply VSS and is adapted for driving the current I1 flowing in the first differential pair (101, 102), a current control transistor 127, which connected to the low potential power supply VSS and is adapted for driving the current I2 flowing in the second differential pair (103, 104), and a group of switches (SW1*a* to SW4*a*, SW1*b* to SW4*b*), which are capable of selectively supplying plural voltages (VB1 to VB4) to respective control terminals (gates) of the current controlling transistors 126 and 127.

FIG. 1 shows a typical configuration of a current mirror circuit (111, 112) which is connected between respective output pairs of the first differential pair (101, 102) and the second differential pair (103, 104) and a high potential power supply VDD. Specifically, the current mirror circuit (111, 112) includes transistors 111 and 112. A source of the transistor 112 is connected to the high potential power supply VDD, and a drain and a gate of the transistor 112 are connected in diode connection to constitute an input terminal of the current mirror circuit. A source and a gate of the transistor 111 are connected to the power supply VDD and the gate of the transistor 112, respectively and a drain of the transistor 111 constitutes an output terminal of the current mirror circuit. An input terminal of the current mirror circuit (drain of the transistor 112) is connected in common to the drains of the transistors 102 and 104, and an output terminal of the current mirror circuit (drain of the transistor 111) is connected in common to the drains of the transistors 101 and 103 to constitute an output terminal 4 of the differential stage which is connected to an input terminal of an amplifier stage 6.

The differential amplifier, shown in FIG. 1, is able to output a voltage resulting from interior division of the voltages VT1 and VT2 at the input terminals T1 and T2 by a preset interior division ratio. A plural number of levels of voltages, with the different interior division ratios, may be output under control by the current control circuit 7 of the current ratio of the currents I1 and I2 flowing through the current control transistors 126 and 127, respectively.

Figure 2:
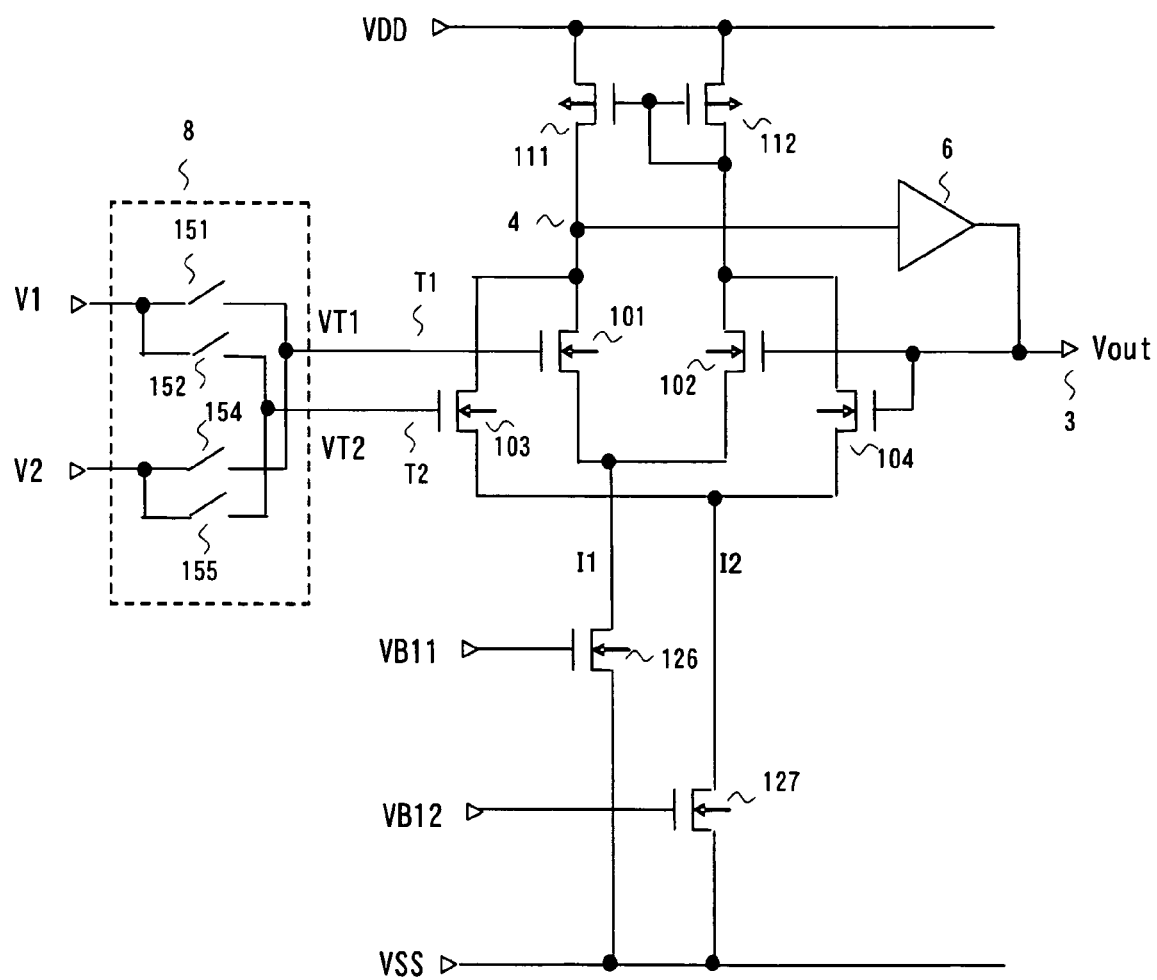
FIG. 2 is a diagram illustrating the configuration of a differential amplifier according to a second embodiment of the present invention.

FIG. 2 is a diagram illustrating the configuration of a differential amplifier according to a second embodiment of the present invention. In the differential amplifier of the above-described first embodiment, shown in FIG. 1, the differential input terminals T1 and T2 of the transistors 101 and 103 are supplied with preset voltages VT1 and VT2, respectively. In the differential amplifier of the second embodiment, shown in FIG. 2, there is provided an input control circuit 8 for selectively supplying two control voltages (V1, V2) to the terminals T1 and T2, as VT1 and VT2, respectively. In FIG. 2, the first differential pair (101, 102) and the second differential pair (103, 104) may be formed by transistors having respective different characteristics.

On the other hand, the control terminals of the current control transistors 126 and 127 are supplied with fixed voltages VB11 and VB12, respectively, such that the currents I1 and I2 are controlled to a preset current ratio. In other respects, the differential amplifier of the present embodiment is similar to that shown in FIG. 1. Hence, the differential amplifier of FIG. 2 is able to output a voltage corresponding to interior division of the voltages VT1 and VT2 at the terminals T1 and T2 by an interior division ratio corresponding to the current ratio of the currents I1 and I2.

The input control circuit 8 comprises switches 151 and 152, which are connected between a terminal supplied with the control voltage V1 and terminals T1 and T2, respectively, and switches 154, 155, which are connected between a terminal supplied with a control voltage V2 and terminals T1 and T2, respectively. By controlling these switches, the two supply voltages (V1, V2), inclusive of the overlapping values, may selectively be supplied to the terminals T1 and T2.

In the differential amplifier, shown in the second embodiment of the present invention, a voltage obtained by interior division of the voltages VT1 and VT2 at the terminals T1 and T2 with a preset interior division ratio may be output. Hence, by selectively supplying the voltages V1 and V2 to the terminals T1 and T2, respectively, by the input control circuit 8, it is possible to output voltages of the same levels as the voltages V1 and V2 and voltages of two levels corresponding to interior division of the voltages V1 and V2.

In the differential amplifiers of the first and second embodiments, shown in FIG. 1, the first differential pair (101, 102) and the second differential pair (103, 104) are n-channel transistors (same polarity type transistors). However, the differential amplifier including two differential pairs of p-channel transistors may, of course, be capable.

The operation of each of the first and second embodiments, shown in FIGS. 1 and 2, will now be described.

Initially, the operation of the above-described first embodiment of the differential amplifier, shown in FIG. 1, for a case where the respective voltages VT1 and VT2 of the terminals T1 and T2 are of different voltage values, and satisfy the condition of VT1<VT2, will be described with reference to FIGS. 3 and 4.

Figure 3:
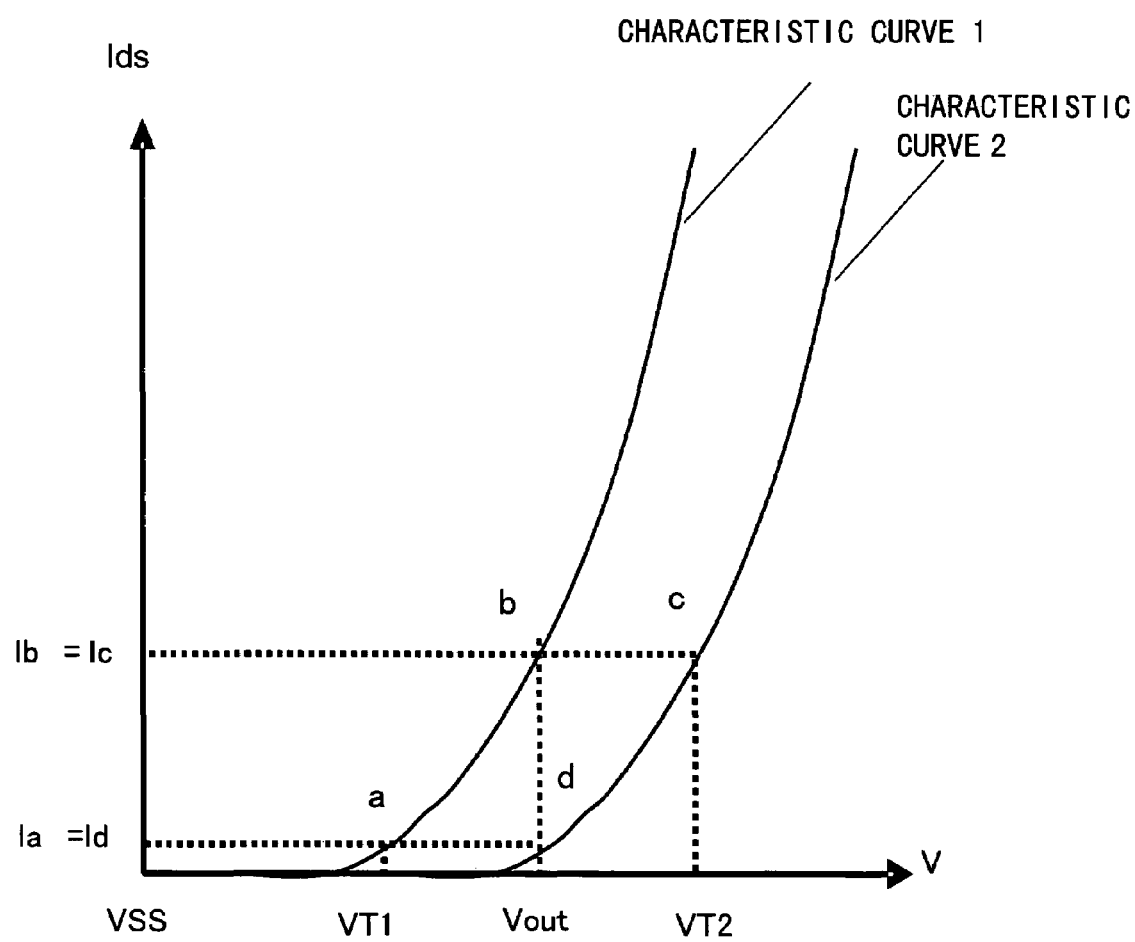
FIG. 3 is a graph of V-I characteristics illustrating the first operation of the first embodiment of the present invention.

FIG. 3 illustrates the operation of the differential amplifier of FIG. 1 for a case where the current ratio of the currents I1 and I2 is equal to the unity.

It is assumed that the transistors of the two differential pairs (101, 102) and (103, 104) of the differential amplifier of FIG. 1 are of the same characteristics.

The current flowing through the transistors 101, 102, 103 and 104 (drain-to-source currents) are represented by Ia, Ib, Ic and Id, respectively.

FIG. 3 shows the relationship between the drain-to-source current Ids and voltage from the voltage of the power supply VSS, plotted on the ordinate and the abscissa, respectively and, more specifically, shows two characteristic curves (Ids-Vg characteristics) of the transistors 101 and 102 and the transistors 103 and 104.

In FIG. 3, the characteristic curve 1 is associated with the transistors 101 and 102, while the characteristic curve 2 is associated with the transistors 103 and 104. The differential pair of the transistors 101 and 102 has operating points a, b, on its characteristic curve, while the differential pair of the transistors 103 and 104 has operating points c, d, on its characteristic curve.

Meanwhile, since the transistors 101 to 104 exhibit the same characteristics, the two characteristic curves are simply shifted along the abscissa. The reason the two characteristic curves of the two differential pairs are shifted from each other is that the tails (terminals connected to sources) are able to undergo individual potential variations.

As for the currents through the transistors 101 to 104, under the above conditions, the equation (1) holds in connection with the differential pair (101, 102).

$$Ia+Ib=I1 \quad (1)$$

Also, the equation (2) holds in connection with the differential pair (103, 104).

$$Ic+Id=I2 \quad (2)$$

As for the current mirror circuit (111, 112), the equation (3) holds.

$$Ia+Ic=Ib+Id \quad (3)$$

Moreover, from the condition of the current ratio relationship (I1=I2) and from the equations (1) and (2), the equation (4) is derived.

$$Ia+Ib=Ic+Id \quad (4)$$

It is assumed that output terminal 4 of the current mirror circuit (drain of the transistor 111) applies only a voltage signal to the amplifier circuit 6, there flowing no steady-state current across the output terminal 4 of the current mirror circuit and the output terminal 3 through the amplifier circuit 6.

Solving the above equations (3) and (4), the relationship of the equations (5) and (6) are derived.

$$Ia = Id \quad (5)$$

$$Ib = Ic \quad (6)$$

That is, under the above conditions, the state in which the currents flowing through the transistors 101 and 104 are equal to each other (Ia=Id) and in which currents flowing through the transistors 102, 103 are equal to each other (Ib=Ic) represents a stable state of the differential amplifier of FIG. 1.

The operating points a to d at this time are at the points of intersection of the characteristic curves 1 and 2 and straight lines Ids=Ia=Id and Ids=Ib=Ic. Since the operating points b and d of the transistors 102 and 104 have V=Vout on the abscissa V of FIG. 3 in common, the operating points b and d are determined, and operating points a and c are also determined. This state is shown in FIG. 3. The figure obtained on interconnecting the four operating points on the characteristic curves of the transistors 101 to 104 is a parallelogram. Since the sides ad and bc of the parallelogram are equal to each other, the output voltage Vout is an intermediate voltage between the voltages VT1 and VT2.

From the above, it follows that, when the transistors 101 to 104 are of equal characteristics, and the ratio of currents I1 and I2 is 1:1, the output voltage Vout is a voltage interiorly dividing the voltages VT1 and VT2 by the ratio of 1:1 (intermediate voltage).

Figure 4:
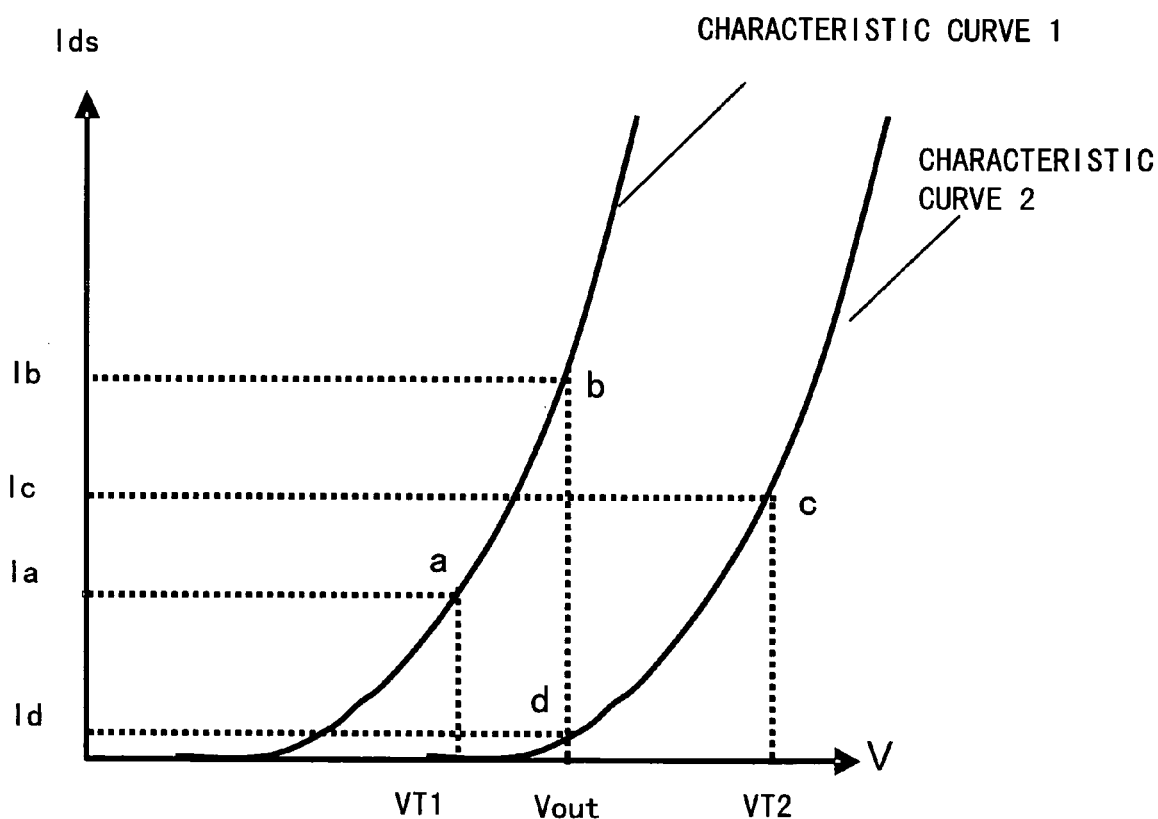
FIG. 4 is a graph of V-I characteristics illustrating the second operation of the first embodiment of the present invention.

Referring to FIG. 4, the case in which the current ratio is changed will now be described. FIG. 4 shows the operation in which the transistors of the two differential pairs (101, 102) and (103, 104) of the differential amplifier of FIG. 1 are of the same characteristics and in which the currents I1 and I2 are set so that I1 is approximately twice as large as I2 (I1=I2×2).

The terminal voltages VT1 and VT2 are also set so that VT1<VT2.

FIG. 4 shows, similarly to FIG. 3, the relationship between the drain-to-source current Ids (ordinate) and the voltage from the power supply VSS. The characteristic curves 1 and 3 stand for the characteristics of the transistors 101 and 102 and the transistors 103 and 104, respectively, with the transistors 101 and 102, 103 and 104 of the two differential pairs having operating points a, b, c and d on the respective characteristic curves, respectively. In FIG. 4, the equations (1) to (3) are valid as the current relationships for the transistors 101 to 104.

From the relationship of the currents I1 and I2 (I1=I2×2), the following equation (7) is valid.

$$Ia+Ib=2\times(Ic+Id) \quad (7)$$

Solving the above equations (3) and (7), the following equations (8) and (9) are derived.

$$Ia=(Ic+3\times Id)/2 \quad (8)$$

and $$Ib=(3\times Ic+Id)/2 \quad (9)$$

In case the current I1 of the current source 126 differs from the current I2 of the current source 127, the simple equation for the case of FIG. 3 does not hold, but the output stable state of the differential amplifier of FIG. 1 is obtained for the case such as that of FIG. 4.

Meanwhile, the operating points b and d of the transistors 102 and 104 have V=Vout on the abscissa in common.

Since the current ratio of the currents I1 and I2 is such that I1 is set to approximately twice as large as I2, the output voltage Vout assumes a value closer to the voltage VT1. Thus, by adjusting the current ratio of the currents I1 and I2, it is possible to take out an output voltage Vout interiorly dividing the voltages VT1 and VT2 with a ratio of approximately 1:2.

Meanwhile, the current ratio of the currents I1 and I2 can be approximated to some extent to a reciprocal of the interior division ratio of the voltages VT1 and VT2 by the output voltage Vout, subject to proper adjustment of the transistor characteristics of the two differential pairs or the values of the currents I1, I2, which may become influencing factors to a more or less extent. However, even in this case, there is generated an increasing shift in the relationship between the reciprocal of the interior division ratio and the current ratio with increase in the voltage difference between VT1 and VT2.

In the foregoing explanation, referenced to FIG. 4, it is assumed that the currents I1 and I2 of the current sources 126 and 127 are such that I1>I2. It may however be readily understood that, if I2=I1×2, such an output voltage Vout may be taken out which interiorly divides the voltages VT1 and VT2 with a ratio of 2:1.

In the differential amplifier of FIG. 1, the input voltages to the terminals T1 and T2 are generally fixed. If the current ratio of the currents I1 and I2 is such that I1>I2, the output voltage Vout becomes a voltage interiorly dividing the voltages VT1 and VT2 at a point closer to the voltage VT1 and, if the same current ratio is such that I1<I2, the output voltage becomes a voltage interiorly dividing the voltages VT1 and VT2 at a point closer to the voltage VT2. The larger the difference between the two currents, the output voltage may be further closer to the voltage VT1 or VT2. By optimizing the condition, it is possible to correlate the current ratio of the currents I1 and I2 with the reciprocal of the interior division ratio of the voltages VT1 and VT2. Thus, with the differential amplifier of FIG. 1, plural level voltages, interiorly dividing the voltages VT1 and VT2, may be output by switching controlling of the current ratio of the currents I1 and I2 by the current control circuit 7.

Meanwhile, if the voltages VT1 and VT2 are set to different values, however, any one of the plural voltages (VB1 to VB4) is set to a value which will turn off the current control transistor 126 or 127, and one of the currents I1 and I2 is cut off by such selection of the bias voltage, the voltage VT1 or VT2 may be output as output voltage Vout. The reason is that, since the differential pair, the current of which has been cut off, becomes inoperative, the voltage output to the other differential pair is output by the voltage follower operation.

Thus, the differential amplifier of FIG. 1 is able to output a voltage equal to any one of the two input voltages, or a voltage of any one of plural voltage levels, interiorly dividing the two input voltages, by changing the current ratio of the currents I1 and I2 flowing through the first differential pair (101, 102) and the second differential pair (103, 104) under control by the group of switches of the current control circuit 7.

The operation of the differential amplifier of the second embodiment of the present invention, described with reference to FIG. 2, will now be described. The differential amplifier of the second embodiment of the present invention is able to selectively supply the two supply voltages V1 and V2 (V1<V2), inclusive of overlapping values, by the input control circuit 8. In FIG. 2, the current ratio of the currents I1 and I2, supplied to the differential pair (101, 102) and to the second differential pair (103, 104), is set to a constant value.

In case the same voltage is supplied to the terminals T1 and T2, by the input control circuit 8, that is, in case one of the voltages V1 and V2 is supplied in common to the terminals T1 and T2 (VT1=VT2), the operation of the differential amplifier of FIG. 2 is equal to that of a routine voltage follower, such that the output voltage Vout becomes equal to the voltage input common to the terminals T1 an T2.

The case in which the different voltages are supplied to the terminals T1 and T2, by the input control circuit 8, that is, in case one of the voltages V1 and V2 is supplied to the terminal T1 and the other is supplied to the terminal T2, will now be described. It is noted that, in case the current ratio of the currents I1 and I2 is such that I1>I2 or I1<I2, the output voltage Vout of the differential amplifier of FIG. 2 is a voltage which interiorly divides the voltages VT1 and VT2 of the terminals T1 and T2 with a preset interior division ratio X:Y, excluding X=Y, as described with reference to FIG. 4.

If, in the case of the differential amplifier, where the current ratio of the currents I1 and I2 is fixed, there lacks the input control circuit 8, and the two voltages, supplied to the terminals T1 and T2, are fixed, the output voltage Vout is a sole level voltage which interiorly divides the voltages VT1 and VT2 of the terminals T1 and T2 with a preset interior division ratio X:Y, However, with the differential amplifier of FIG. 2, the voltages supplied to the terminals T1 and T2 can be interchanged by the input control circuit 8. Hence, the output voltage Vout is able to assume a level voltage corresponding to interior division X:Y or a level voltage corresponding to interior division Y:X of the two voltages supplied to the terminals T1 and T2.

That is, with the differential amplifier of FIG. 2, plural levels of voltages with different interior division ratios may be output by interchanging voltages supplied to the terminals T1 and T2.

A modification of the differential amplifier of FIG. 2 will now be described. The differential amplifier of FIG. 2 may be configured so that the current ratio of the currents I1 and I2 is equal to unity (I1=I2) and so that the transistors of the differential pairs (101, 102) and (103, 104) are of different characteristics. The operation for this case will now be described with reference to FIG. 5.

Figure 5:
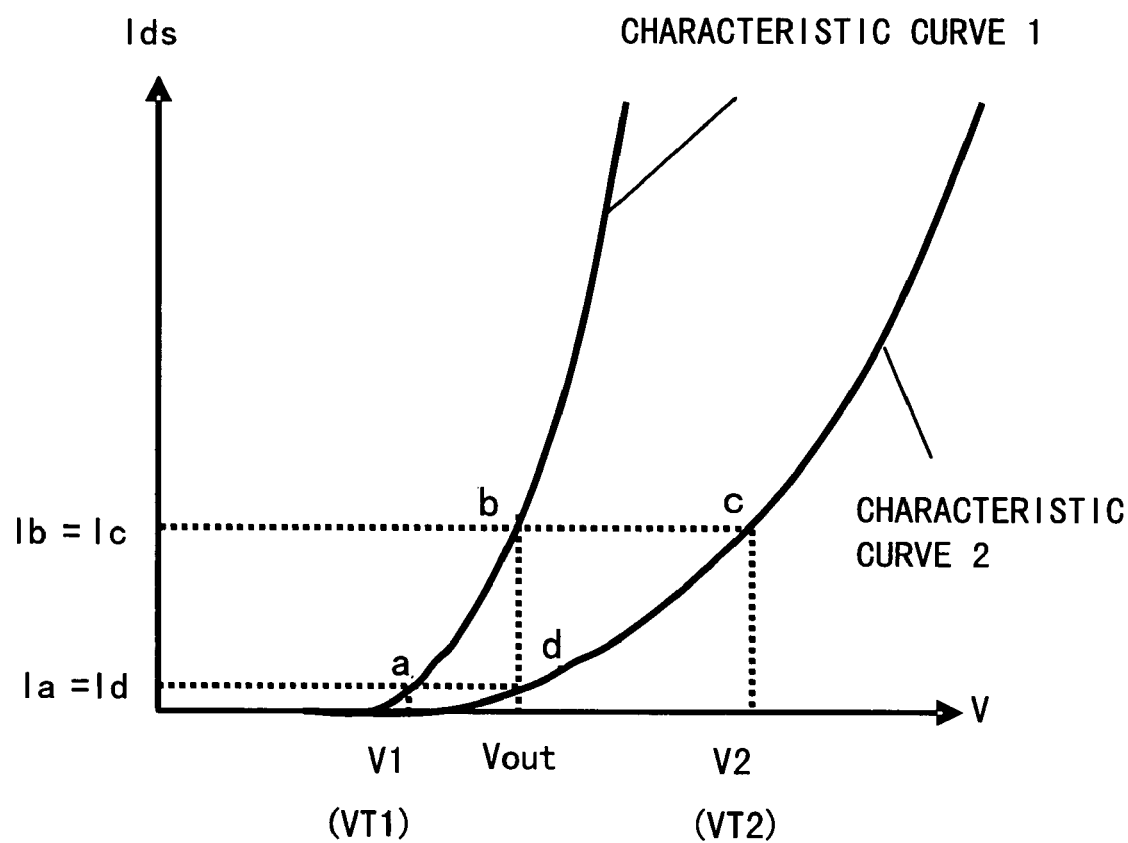
FIG. 5 is a graph of V-I characteristics illustrating the first operation of the second embodiment of the present invention.

FIG. 5 shows the operation of a case in which, in the two differential pairs (101, 102) and (103, 104) of the differential amplifier of FIG. 2, the W/L ratio (ratio of the channel width W to the channel length L) of the differential pair (101, 102) is set to twice as large as that of the differential pair (103, 104).

FIG. 5 shows a case where the voltage V1 (VT1=V1) and the voltage V2 (VT2=V2), where V1<V2, are selectively output to the terminals T1 and T2, respectively.

FIG. 5 shows, similarly to FIG. 3, the relationship between the drain-to-source current Ids (ordinate) and the voltage V against the power supply VSS (abscissa), and a characteristic curve 1 corresponds to the transistors 101 and 102, while a characteristic curve 2 corresponds to the transistors 103 and 104, with the transistors of 101, 102 of the differential pair having operating points a and b on the characteristic curve 1 and with the transistors of 103, 104 of the other differential pair having operating points c and d on the characteristic curve 2.

It should be noted that, since the differential pairs (101, 102) and (103, 104) are formed to have different W/L ratios, the two characteristic curves are shifted from each other along the abscissa, with the slopes thereof being different from each other.

When the current ratio of the currents I1 and I2 is such that I1=I2, the relationship of the currents in the transistors 101 to 104 in the differential amplifier of FIG. 2 is similar to that shown in FIG. 3 and the above equations (1) to (6) are valid.

The operating points a, b, c and d at this time are at the points of intersection of the characteristic curves 1 and 2 and straight lines Ids=Ia=Id and Ids=Ib=Ic. On the other hand, since the operating points b, d of the transistors 102 and 104 have V=Vout on the abscissa V of FIG. 5 in common, the operating points are as shown in FIG. 5.

It is seen from FIG. 5 that the slope of the characteristic curve 1 is twice that of the characteristic curve 2. The output voltage Vout at this time is such a voltage interiorly dividing the voltages VT1 and VT2 at the terminals T1 and T2 by a ratio of 1:2. It is noted that this interior dividing ratio of the voltages VT1 and VT2 depends on the size ratio of the two differential pairs (101, 102), (103, 104), so that, by optimally setting the size ratio, it is possible to output a voltage interiorly dividing by a desired interior division ratio.

Thus, when a voltage V1 (VT1=V1) and a voltage V2 (VT2=V2) are selectively supplied to the terminals T1 and T2, by the input control circuit 8, respectively, the output voltage Vout is such a voltage which interiorly divides the voltages V1 and V2 by 1:2, as shown in FIG. 5. On the other hand, in case a voltage V2 (VT1=V2) and a voltage V1 (VT2=V1) are selectively supplied to the terminals T1 and T2 by the input control circuit 8, respectively, the output voltage Vout is such a voltage which interiorly divides the voltages V1 and V2 by 2:1. Hence, the differential amplifier of FIG. 2 interchanges the voltages output to the terminals T1 and T2 by the input control circuit 8 to output voltages of different levels with the different interior division ratio.

Figure 6:
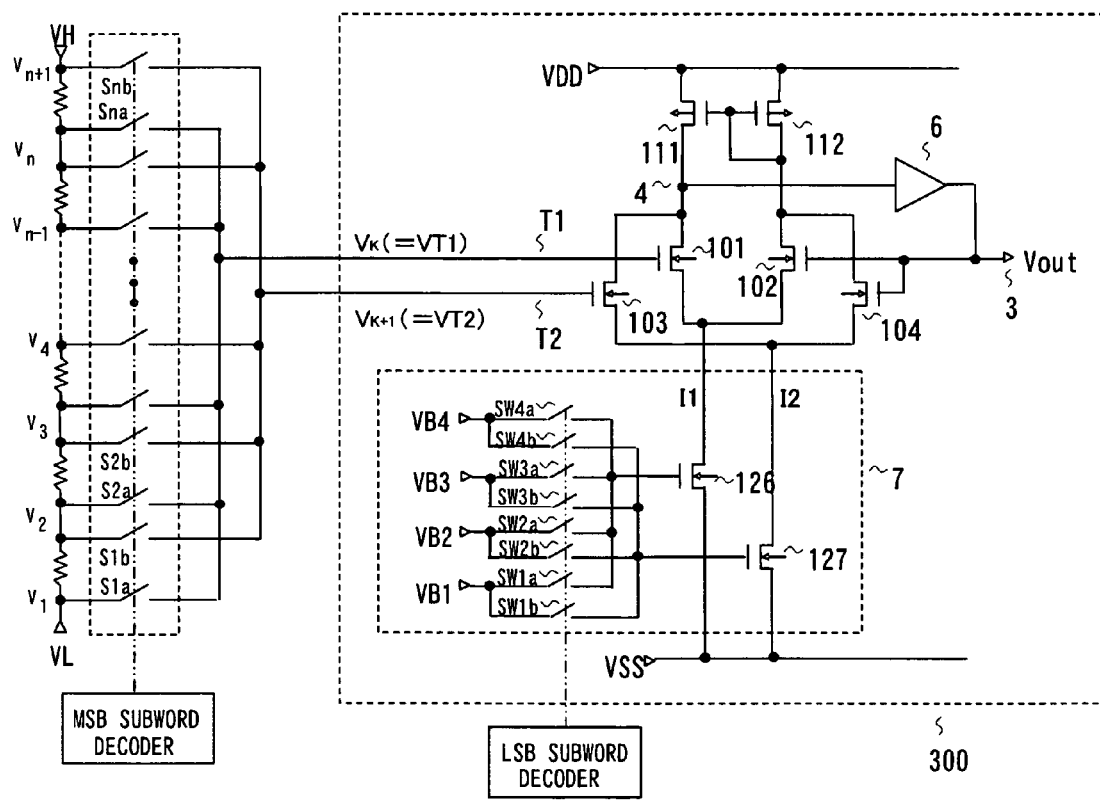
FIG. 6 is a diagram illustrating the configuration of a digital-to-analog converter according to a third embodiment of the present invention.

A third embodiment of the present invention will now be described. FIG. 6 is a diagram illustrating the configuration of a digital-to-analog converter, abbreviated to 'DAC', according to a third embodiment of the present invention. Referring to FIG. 6, in the DAC of the third embodiment of the present invention, the amplifier 200 of the DAC and the third group of the switches SW1 to SW3 of FIG. 18 are replaced by a differential amplifier 300 employing the differential amplifier of the first embodiment of the present invention shown in FIG. 1.

Figure 18:
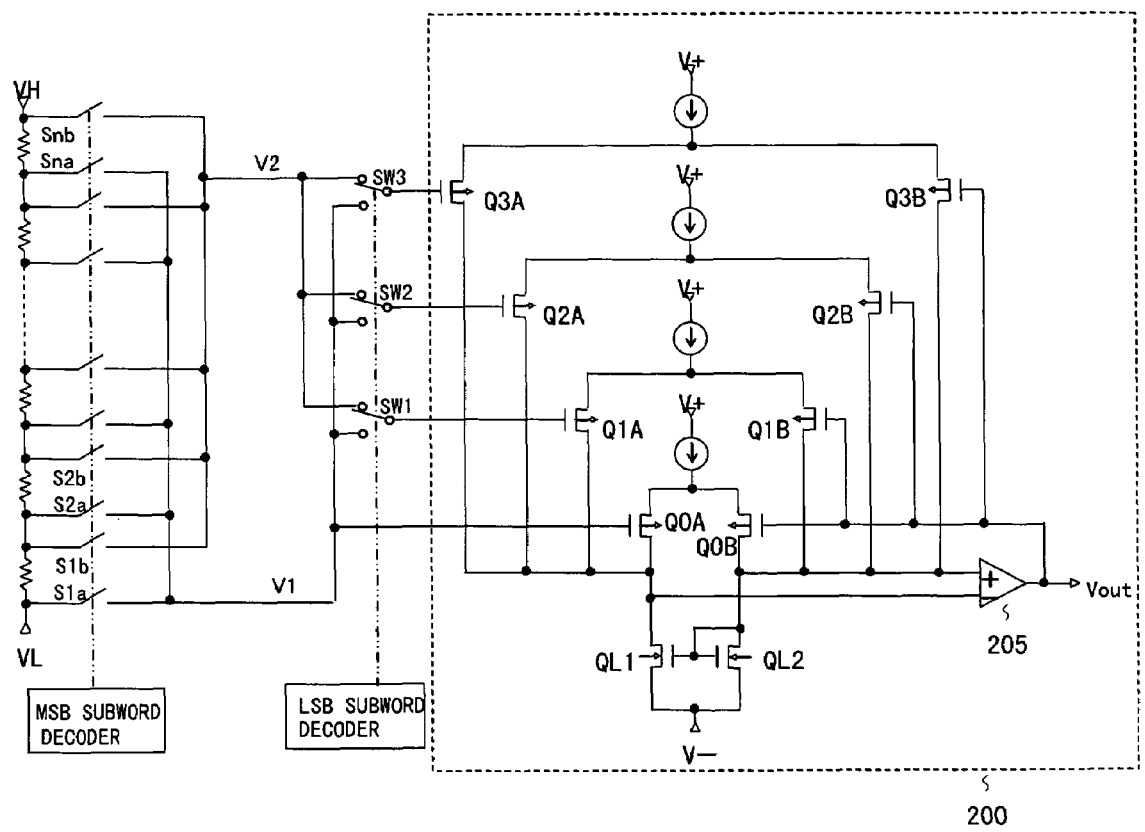
FIG. 18 is a diagram illustrating the configuration of a conventional digital-to-analog converter.
Figure 19:
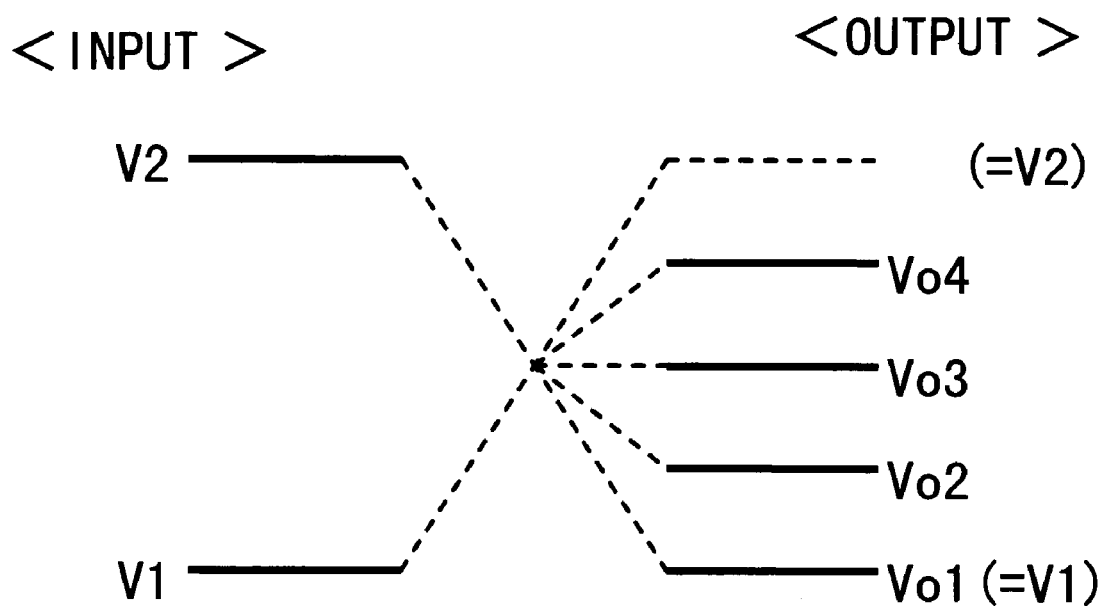

In the DAC of FIG. 6, the means for selecting the two voltages, output to the terminals T1 and T2 of the differential amplifier 300, is the same as that used in FIG. 18. That is, the means for selecting the two voltages is made up by a resistor string, outputting (n+1) analog voltages $V_1$, $V_2, \ldots,$ and $V_{n+1}$ from respective tap voltages, a first set of switches, constituted by n switches S1a to Sna, for selecting one voltage $V_K$ from the respective taps, where K is an integer from 1 to n, and a second set of switches, constituted by n switches of from S1b to Snb, for selecting a voltage $V_{K+1}$ of a level neighboring to the voltage $V_k$. The means for selecting the two voltages is able to turn on the K'th switches (Ska and Skb) of the first and second groups of switches, by the output of an MSB subword decoder, which is based on the upper bit signals of the input data, to select the voltage of the neighboring taps as $V_K$ (=VT1) and $V_{K+1}$ (=VT2).

The DAC according to the third embodiment of the present invention differs from the DAC shown in FIG. 18 in that, in the present third embodiment, the respective switches of the current control circuit 7 are controlled by an output of an LSB subword decoder which is based on lower bit signals of input data. That is, in the third embodiment of the present invention, voltages of plural levels interiorly dividing the voltages $V_K$ and $V_{K+1}$ output to the terminals T1 and T2 may be output. Since the number of the differential pairs is not increased, even though the number of voltage levels interiorly dividing the voltages $V_K$ and $V_{K+1}$ is increased, marked area saving may be achieved as compared to the configuration of FIG. 18. If, in the present third embodiment, the number of voltage levels interiorly dividing the voltages $V_K$ and $V_{K+1}$ is increased, the number of bias voltages to be supplied to the control terminals of the current control transistors 126 and 127, or that of the switches for switching the bias voltages is increased, however, the bias voltages may be shared by plural differential amplifiers 300. Since the switch may be formed by a transistor of the minimum size, there is only small adverse effect on increasing the area. On the other hand, if the number of voltage levels, interiorly dividing the voltages V1 and V2, selected by the output of the MSB subword decoder, is increased, the number of the groups of the differential pairs, the number of the current sources driving them and the number of the groups of the third switches for selectively outputting the voltages V1 and V2 to one ends of the differential pairs are increased. Since the variations in the properties of the transistors forming the differential pair and the current source directly affect the accuracy of the linear output, these transistors need to be designed to a more or less large size, thus leading to an increased area.

Figure 16:
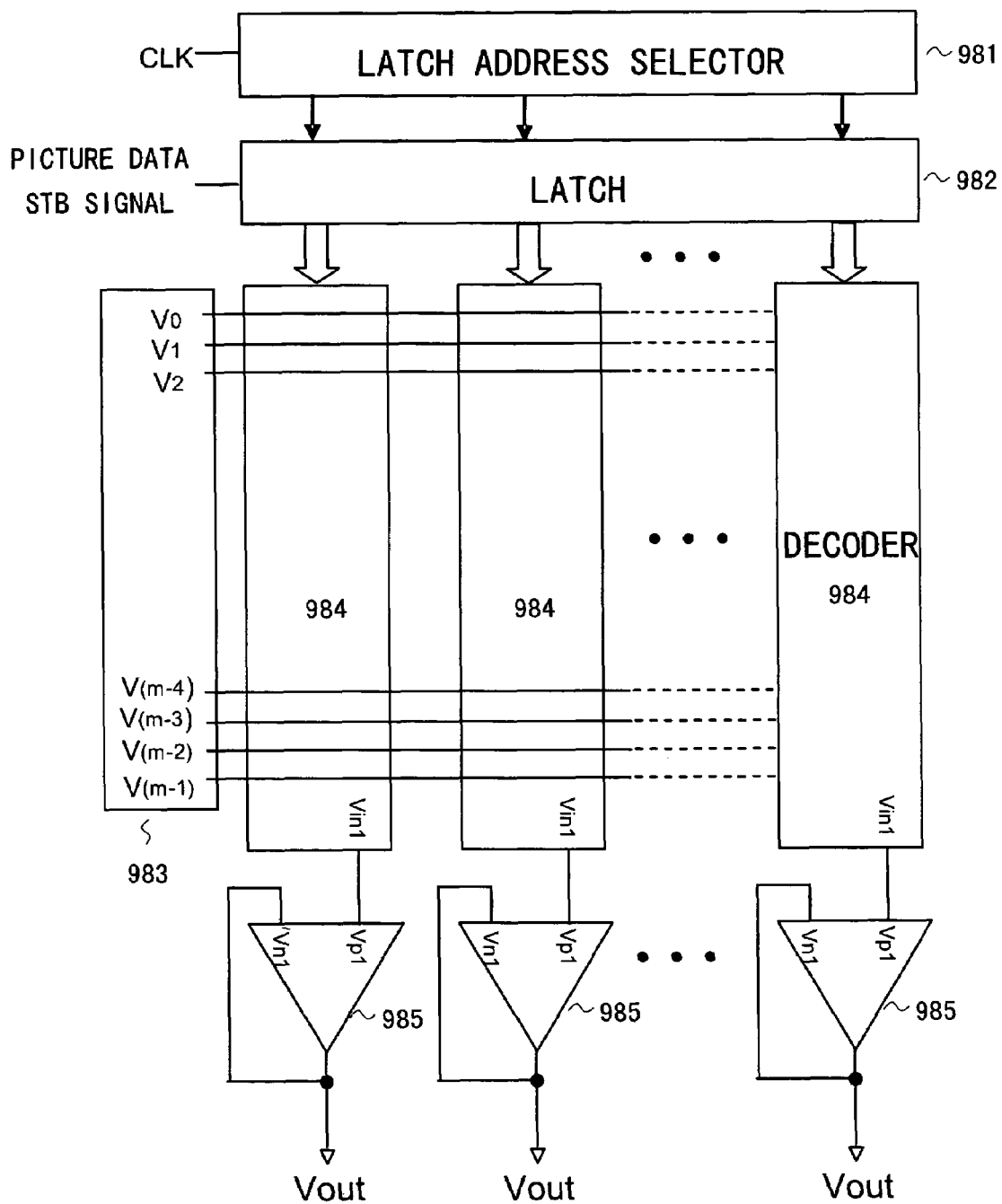
FIG. 16 is a diagram illustrating the configuration of a conventional data driver.
Figure 17:
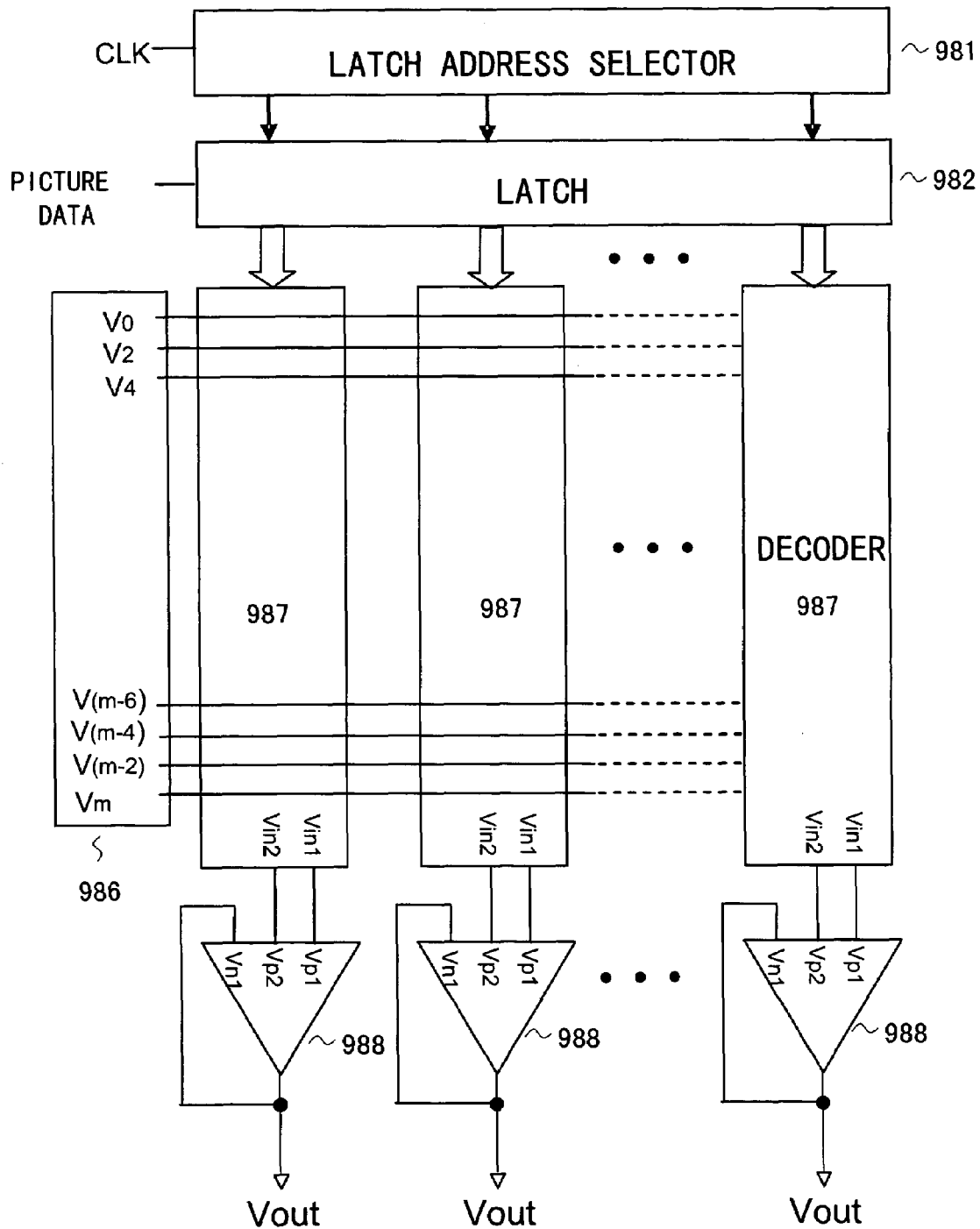
FIG. 17 is a diagram illustrating a modification of the configuration of the conventional data driver.

If the principle of the DAC of FIG. 6 is applied to the gray scale voltage generating circuit 986, decoder 987 and to the buffer circuit 988 of FIG. 17, the number of gray level voltages, output from the gray scale voltage generating circuit 986, may be appreciably reduced to one half of the number of gray scale voltages of FIG. 16, or less. In addition, the number of the devices of the decoder 987, selecting the gray scale voltages, may be reduced, thus appreciably reducing the circuit scale.

Figure 7:
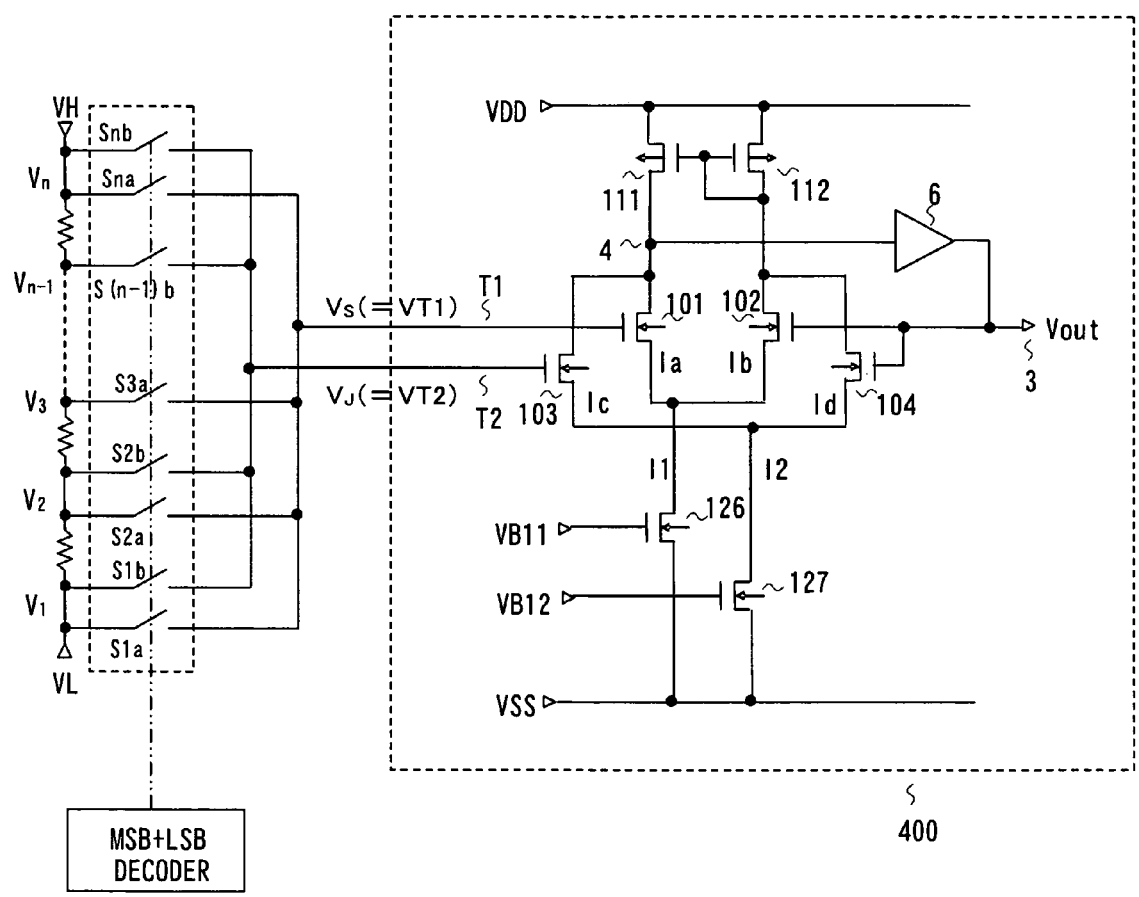
FIG. 7 is a diagram illustrating the configuration of a digital-to-analog converter according to a fourth embodiment of the present invention.

FIG. 7 is a diagram illustrating the configuration of a digital-to-analog converter (DAC) according to a fourth embodiment of the present invention. In the DAC shown in FIG. 18 or in FIG. 6, two voltages ($V_K$, $V_{K+1}$) of neighboring taps of n voltages, generated by a resistor string, are selected and supplied to the differential amplifier. In the fourth embodiment of the present invention, shown in FIG. 7, the number of tap voltages may be decreased with respect to the number of output voltage levels, by selecting not only the two neighboring tap voltages but also any optional tap voltages, such as two tap voltages with one tap in-between or with two taps in-between.

Referring to FIG. 7, the means for selecting two voltages, output to the terminals T1 and T2 of a differential amplifier 400, includes a resistor string for outputting n analog voltages V1, V2, ..., and Vn from respective taps, a first group of n switches S1a to Sna for selecting a sole voltage Vs from the taps, where S denotes an integer from 1 to n, and a second group of n switches S1b to Snb for selecting a sole voltage V1 from the taps, where J denotes an integer from 1 to n. A number S switch Ssa and a number J switch Sjb are turned on by an output of a decoder which is based on the totality of bit signals of the input data (MSB+LSB) to select a combination of optional tap voltages, including overlapping values (Vs, and V1) as the voltages (VT1, VT2) of the terminals T1 and T2. Meanwhile, the DAC of FIG. 7 may be regarded as an extension by n of the number of voltage supply terminals of the input control circuit 8 of FIG. 2.

In the DAC of FIG. 7, a differential amplifier 400 is desirably such a differential amplifier capable of maintaining a preset interior division ratio to provide for a high precision output even for a wide voltage difference area of two voltages output to terminals T1 and T2. For example, the differential amplifier capable of outputting an intermediate voltage of two input voltages, described with reference to FIG. 3, is among these desirable types of the differential amplifiers. That is, such a differential amplifier, shown in FIG. 2, in which two differential pairs (101, 102) and (103, 104) are formed by transistors of the same characteristics, and in which the current ratio of the currents I1, I2 flowing through the two differential pairs (101, 102) and (103, 104) is equal to unity (I1=I2), may be used.

The operation of the differential amplifier 400 is the same as that described with reference to FIG. 3. That is, the output voltage Vout is a voltage which interiorly divides the voltages VT1 and VT2 at the terminals T1 and T2 by a ratio of 1:1. This operation is established without regard to the potential difference of the voltages VS (=VTI) and VJ (=VT2), supplied to the terminals T1 and T2 in FIG. 7, and also without regard to the profile of the characteristic curve if only the transistors of the two differential pairs are of the same characteristics. Meanwhile, if, in case the transistors of the differential pairs exhibit e.g. the channel-length-modulation effect or the like, the voltage difference between the two voltages VS and VJ is increased excessively, there are occasions where the output voltage Vout is deviated gradually from the intermediate voltage. In general, the operation is established over a relatively wide range.

A specified embodiment in which the number of tap voltages may be decreased as compared to the number of output voltages by selection of optional combinatorial voltages (Vs, Vj) of the first and second groups of switches of FIG. 7 will now be described. In the following specified embodiment, such a case is described in which a linear output with equal intervals between output voltage levels is to be implemented.

FIG. 8 shows an example of a method for selecting the two input voltages to be output to the terminals T1 and T2 of the differential amplifier 400 of FIG. 7. FIG. 8 shows, in a tabulated form, nine equally spaced apart level voltages, four voltages A to D, different from one another, output from respective taps of the resistor string of FIG. 7, and the combination of two voltages, entered to the terminals T1 and T2. Meanwhile, it does not matter which one of the combinations of the two voltages is output to which one of the terminals T1 and T2.

In FIG. 8, the number of voltages supplied to the terminals T1 and T2 is only four against the nine level output voltages, that is, less than one-half of the number of the output voltage levels. However, the two voltages may be combined so that, when the voltage A is selectively supplied to one of the two terminals (T1, T2), any of voltages A, B, C and D, that is, four voltages, may be supplied to the other terminal. Thus, there are a sum total of ten combinations of two out of four voltages, such that a 9-level linear output is possible.

The four input voltages A to D are set to first, third, seventh and ninth voltage levels, against the nine-level output voltages.

As for the combination of two voltages, output to the terminals (T1, T2), accomplishing the fifth level output, the combination of the voltages B and C or the combination of the voltages A and D may be used.

In FIG. 8, the first to eighth levels, out of the nine-level output voltages, may be associated with (0, 0, 0) to (1, 1, 1) for three-bit digital data.

FIG. 9 shows another specified example of the method for selecting two voltages output to the terminals T1 and T2 of the differential amplifier 400 of FIG. 7.

FIG. 9 shows, in a tabulated form, 17 equally spaced apart level voltages, six voltages A to F, different from one another, output from respective taps of the resistor string of FIG. 7, and the combination of two voltages, output to the terminals T1 and T2. Meanwhile, it does not matter which one of the combinations of the two voltages is output to which one of the terminals T1 and T2.

In FIG. 9, the number of voltages supplied to the terminals T1 and T2 is only six against the 17 level output voltages, that is, approximately one-third of the number of the output voltage levels. However, there are 21 combinations of two out of six voltages, whereby 17-level linear outputs are feasible. The four voltages A to F are set in the first, third, seventh, eleventh, fifteenth and seventeenth voltage levels, respectively. There are plural combinations of the bi-level inputs outputting the seventh, ninth and eleventh levels. In FIG. 9, the first to sixteenth levels, out of the seventeen level output voltages, may be associated with (0, 0, 0, 0) to (1, 1, 1, 1) for four-bit digital data.

In FIGS. 8 and 9, typical examples for reducing the number of voltages supplied from the taps of the resistor string of FIG. 7 to the differential amplifier capable of outputting an intermediate voltage of two voltages supplied to the terminals T1 and T2, are shown for 9-level and 17-level linear outputs. However, the present invention may be applied to linear outputs of larger numbers of multi-levels.

According to the present invention, if the number of linear output voltage levels is m, m being a multiple of 8 plus 1, the number of voltages supplied from the respective taps of the resistor string of FIG. 7, that is, the number of voltages supplied to the terminals T1 and T2, may be reduced to [{(m−1)/4}+2].

In this case, the voltages supplied from the respective taps of the resistor string of FIG. 7 are set to the first, (3+4k)'th and m'th levels, against m output levels, k is set to an integer not less than 0, and the (3+4k)'th level is set to include the (m−2)'th level.

FIG. 8 shows a case where m=9 and k=0, 1 and FIG. 9 shows a case where m=17 and k=0, 1, 2, 3.

As described above, in the DAC of FIG. 7, the differential amplifier 400 is able to output only voltages having a fixed interior division ratio relative to the two input voltages T1 and T2. However, the DAC may be adapted to output a large number equal to twice or more of the n voltages output from the taps of the resistor string, by selecting the combination voltages by the first and second groups of switches responsive to the input data.

By applying the DAC of the embodiment of the present invention to the gray scale voltage generating circuit 986, decoder 987 and to the buffer circuit 988 of FIG. 17, the number of gray level voltages, output from the gray scale voltage generating circuit 986, may be appreciably reduced to one half of the number of gray level voltages of FIG. 16, or less. In addition, the number of the devices of the decoder 984, selecting the gray level voltages, may be reduced, thereby reducing the circuit scale appreciably.

Although the present embodiments of the differential amplifiers and digital-to-analog converters according to the present invention are described in the foregoing, the configurations of FIGS. 1 to 7 may be replaced by transistors formed without back gates on an insulating substrate, formed of glass or plastics. In such case, the operation and effect similar to those described above may similarly be achieved.

With a data driver, having a differential amplifier or a digital-to-analog converter according to the present invention, it is possible to reduce the decoder area to enable cost reduction. If the data driver is used as a data driver of FIG. 15, it becomes possible to achieve cost reduction of the liquid crystal display apparatus.

Figure 15:
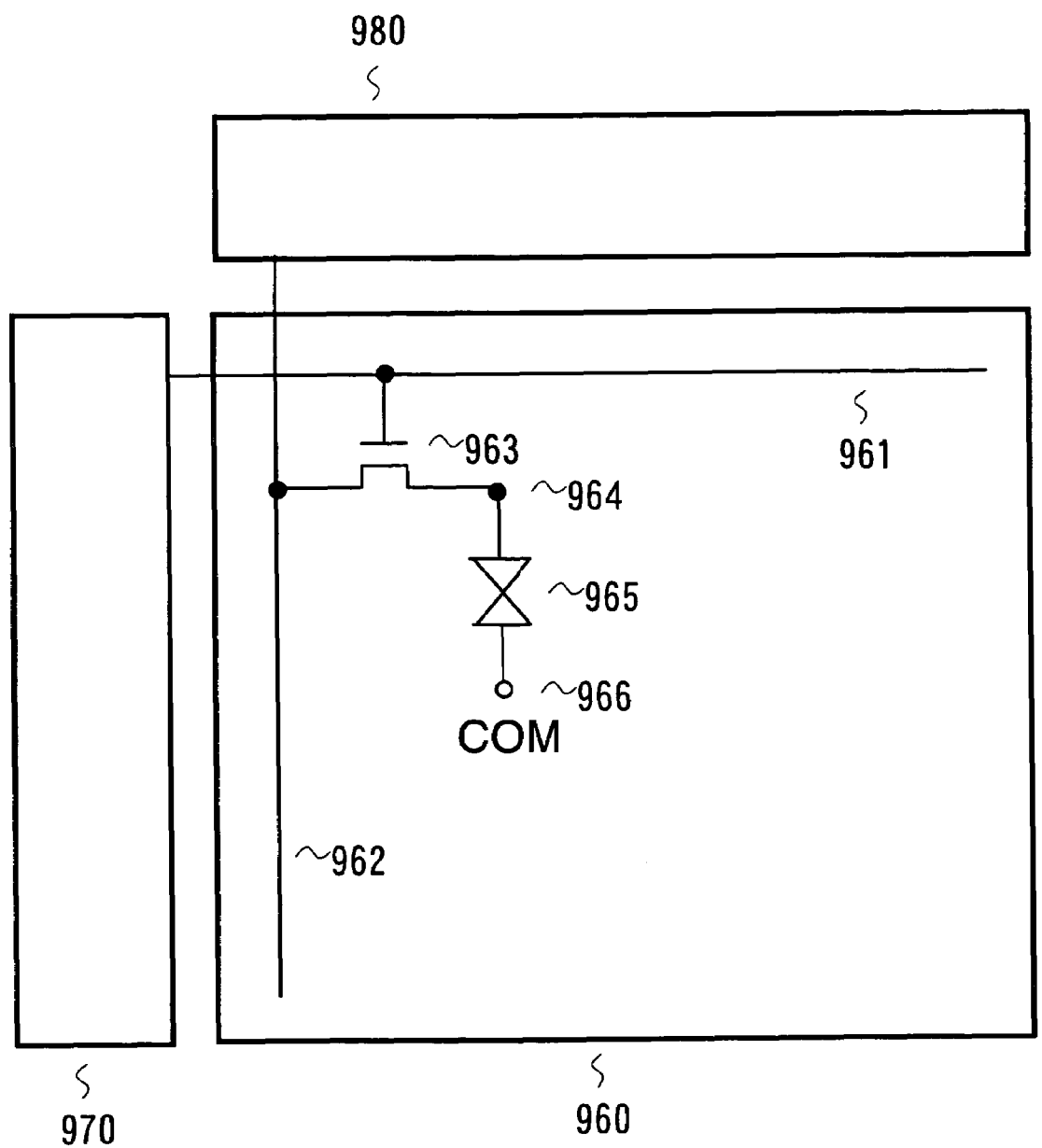
FIG. 15 is a diagram illustrating the configuration of a display apparatus.

Meanwhile, in the liquid crystal display apparatus of FIG. 15, the data driver 980 may be connected distinctly as a silicon LSI and connected to the display 960. Or, a circuit may be formed using e.g. polysilicon TFT (thin-film transistor) as an insulating substrate, such as a glass substrate, for forming the data driver as one with the display 960. In particular, if the data driver is formed as one with the display, the data driver may be reduced in area, so that it is possible to reduce the frame portion (that is, the width between the outer rim of the display 960 and the outer rim of the substrate).

By applying the differential amplifier of the present invention to any data driver of the display apparatus, including the display apparatus of the alternative configuration, it is possible to save the cost and to narrow the frame portion. For example, the differential amplifier of the present invention may, of course, be applied to a display apparatus outputting and demonstrating multi-level voltage signals on a data line, similarly to the liquid crystal display apparatus, such as an organic EL display of the active matrix driving system.

Referring to the drawings, the results of simulation carried out in order to verify the operation and favorable effect of the differential amplifiers of the above mentioned embodiments of the present invention, will now be described.

Figure 10:
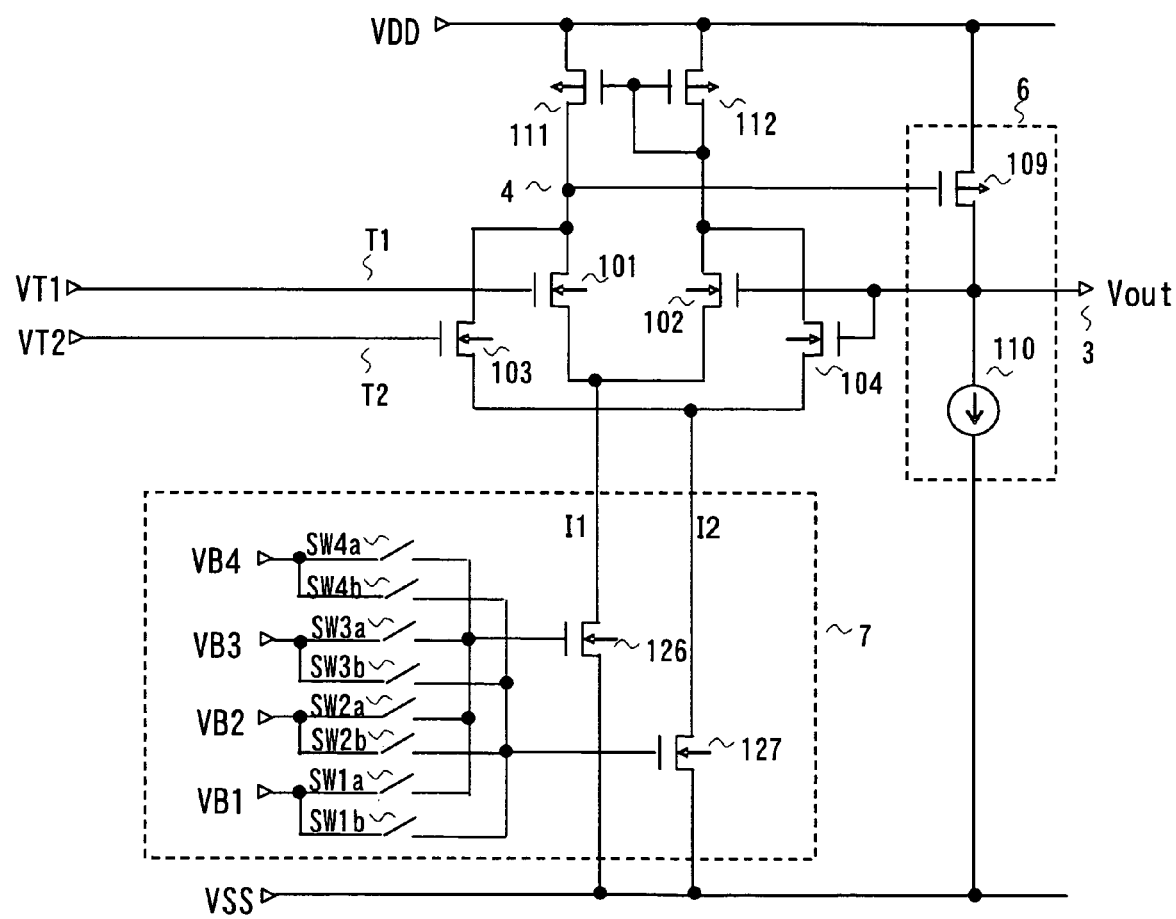
FIG. 10 is a diagram illustrating the configuration of a differential amplifier of the present invention used for simulation.

FIG. 10 is a diagram illustrating a simulation circuit for a differential amplifier for verifying the results of the first embodiment of the present invention. FIG. 10 also shows a specified example of the first embodiment shown in FIG. 1. An amplifier stage 6 comprises a P-channel transistor 109, which is for charging the output terminal 3, and a current source 110 which is connected between the output terminal 3 and the power supply VSS to discharge the output terminal 3. In other respects, the configuration is similar to that shown in FIG. 1.

A transistor 109 is connected between the high potential power supply VDD and the output terminal 3 and has a gate connected to an output terminal 4 (drain of the transistor 111) of the current mirror circuit (111, 112). The current source 110 is connected between the low potential power supply VSS and the output terminal 3. Although not shown in FIG. 10, a phase compensation capacitor, not shown, is provided as necessary across the transistor 109 and the output terminal 3.

Figure 11:
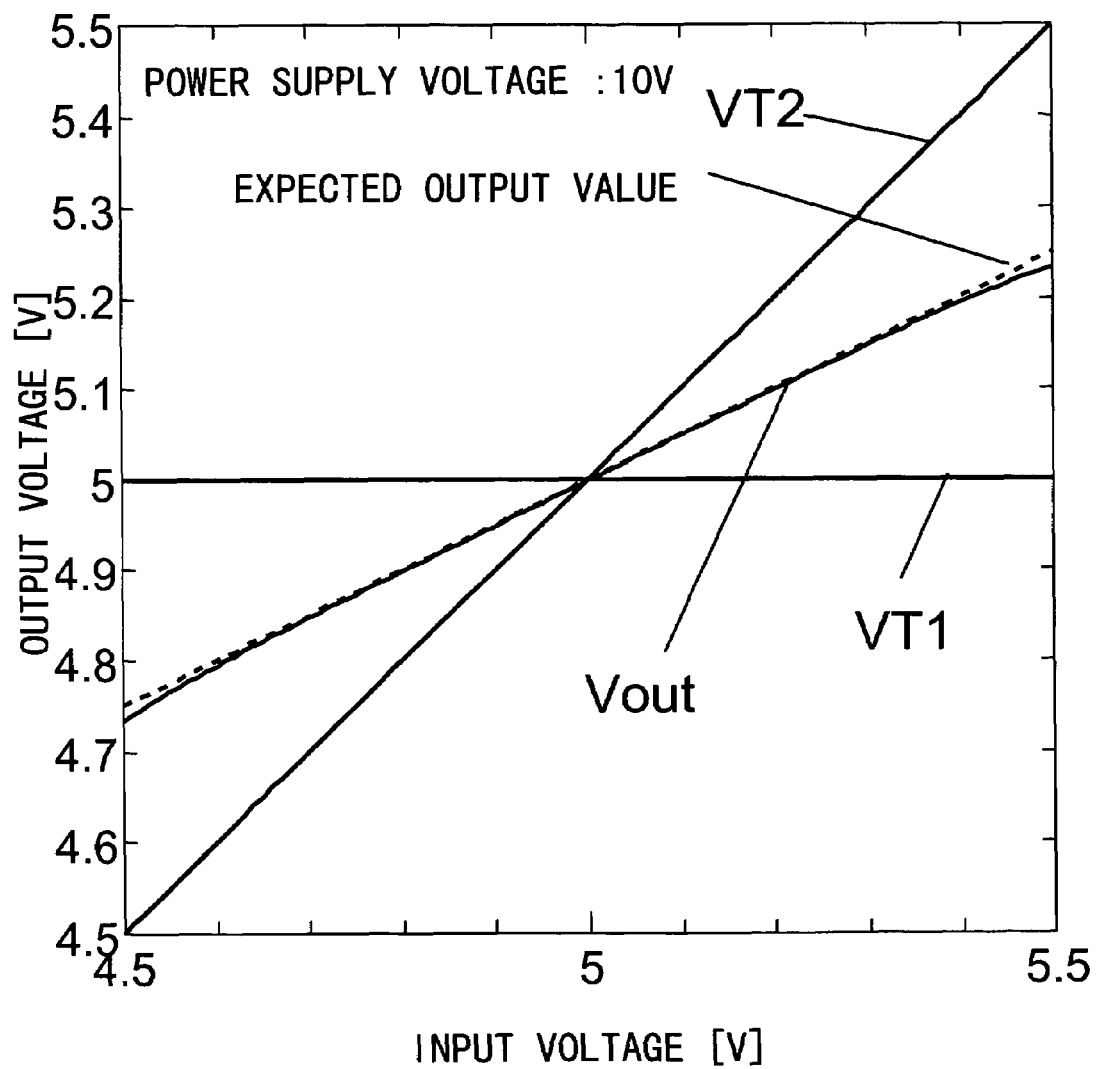
FIG. 11 is a graph illustrating input/output characteristics in a third operation of the differential amplifier of the present invention.

FIG. 11 shows input/output characteristics (simulation) when the differential pair (101, 102) and the second differential pair (103, 104) are formed by transistors of the same characteristics, the current ratio of the currents I1, I2 is equal to unity (I1=I2) and the operation of FIG. 3 of outputting an intermediate voltage of the voltages VT1 and VT2 at the terminals T1 and T2 is carried out.

FIG. 11 shows output characteristics of the output voltage Vout when the voltage VT1, out of the two voltages VT1 and VT2 at the terminals T1 and T2 of the differential amplifier, is constant and when the voltage VT2 is varied within a range of ±0.5V relative to VT1.

At this time, the output voltage Vout becomes a voltage bisecting the two voltages (VT1, VT2). An expected output value is shown by a broken line in FIG. 11.

It is seen from FIG. 11 that the output voltage Vout shows good coincidence with an expected output value within a range of ±0.5V, with 5V as center, and that a voltage intermediate between the two input voltages may be output to a high accuracy over a wide voltage range.

The above results are valid for a DAC of the fourth embodiment of the present invention shown in FIG. 7. If, in the differential amplifier 400 shown in FIG. 7, the two differential pairs (101, 102) and (103, 104) are formed by transistors of the same characteristics and the currents I1, I2 flowing through the respective differential pairs are equal (I1=I2), the intermediate voltage of the voltages VT1 and VT2 of the terminals T1 and T2 may be output to high accuracy over a wide voltage range. Hence, the meritorious effect, described with reference to FIGS. 8 and 9, may be achieved, such that it becomes possible to reduce appreciably the number of tap voltages as compared to the number of output voltages.

Figure 12:
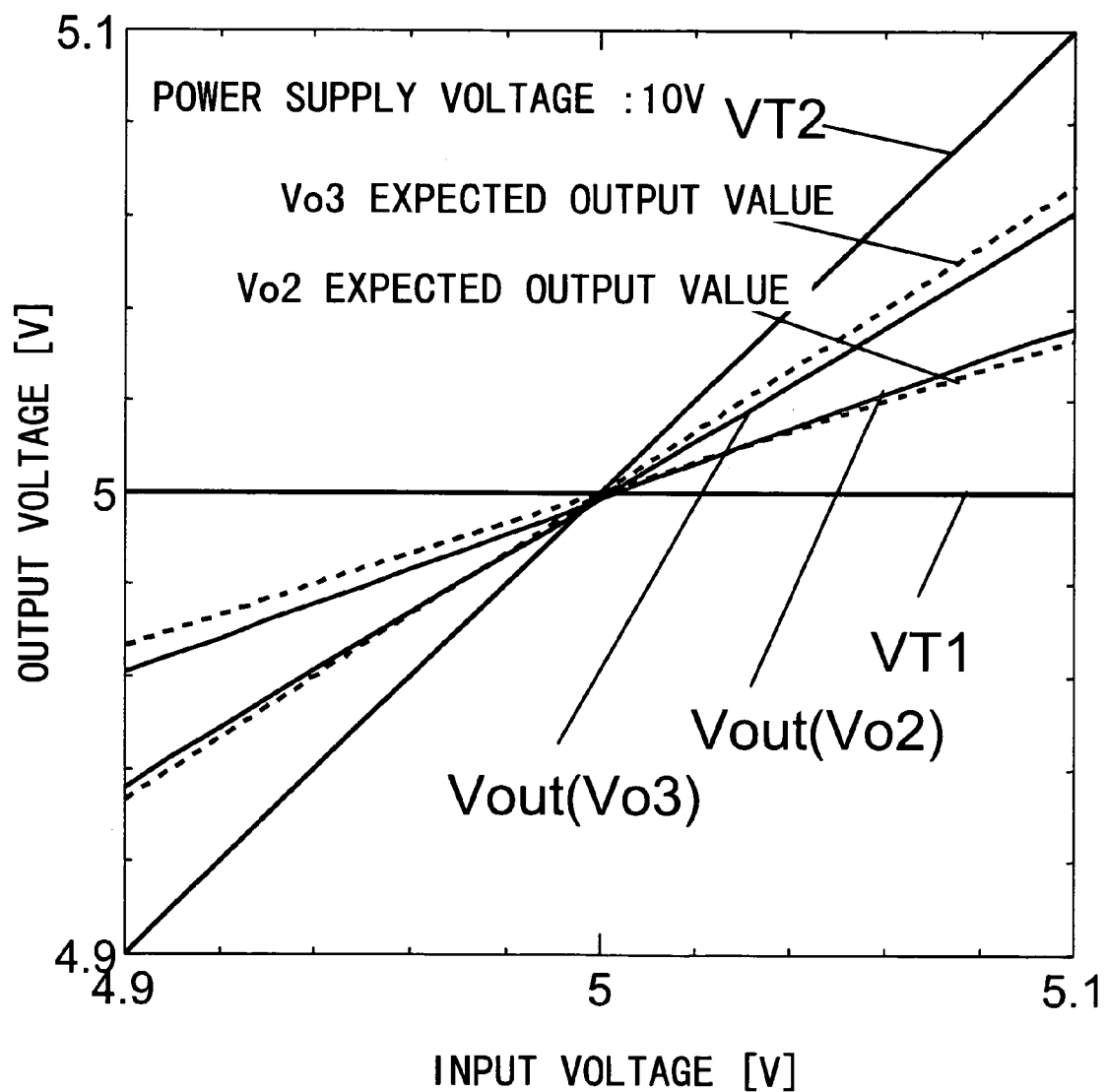
FIG. 12 a graph illustrating input/output characteristics in a fourth operation of the differential amplifier of the present invention.

FIG. 12 depicts input/output characteristics resulting from the simulation in which the two differential pairs (101, 102) and (103, 104) of the differential amplifier of FIG. 10 are constituted by transistors of the same characteristics and the current ratio of the respective currents I1 and I2 flowing through the differential pairs is changed under control by the current control circuit 7.

FIG. 12 shows input/output characteristics resulting from the simulation in which the current ratio of the currents I1 and I2 is switched to 2:1 and to 1:2. When the current ratio of the currents I1 and I2 is switched to 2:1 and to 1:2, the output voltage Vout becomes Vo2 and Vo3, respectively. Also, the expected output values in case the voltages VT1 and VT2 at the terminals T1 and T2 are interiorly divided by the ratios of 1:2 and 2:1 are denoted by broken lines labeled expected output value Vo2 and expected output value Vo3, respectively.

It may be confirmed from FIG. 12 that the interior division ratio of the voltages VT1 and VT2 at the terminals T1 and T2 approximately corresponds to a reciprocal of the current ratio of the currents I1 and I2, and that the output voltage Vout approximately coincides with the expected output values (expected output value Vo2 and expected output value Vo3) within a range of ±0.1V. Meanwhile, the output voltage Vout is progressively deviated from the expected output value for the voltage range in which the output voltage exceeds ±0.1V.

Figure 13:
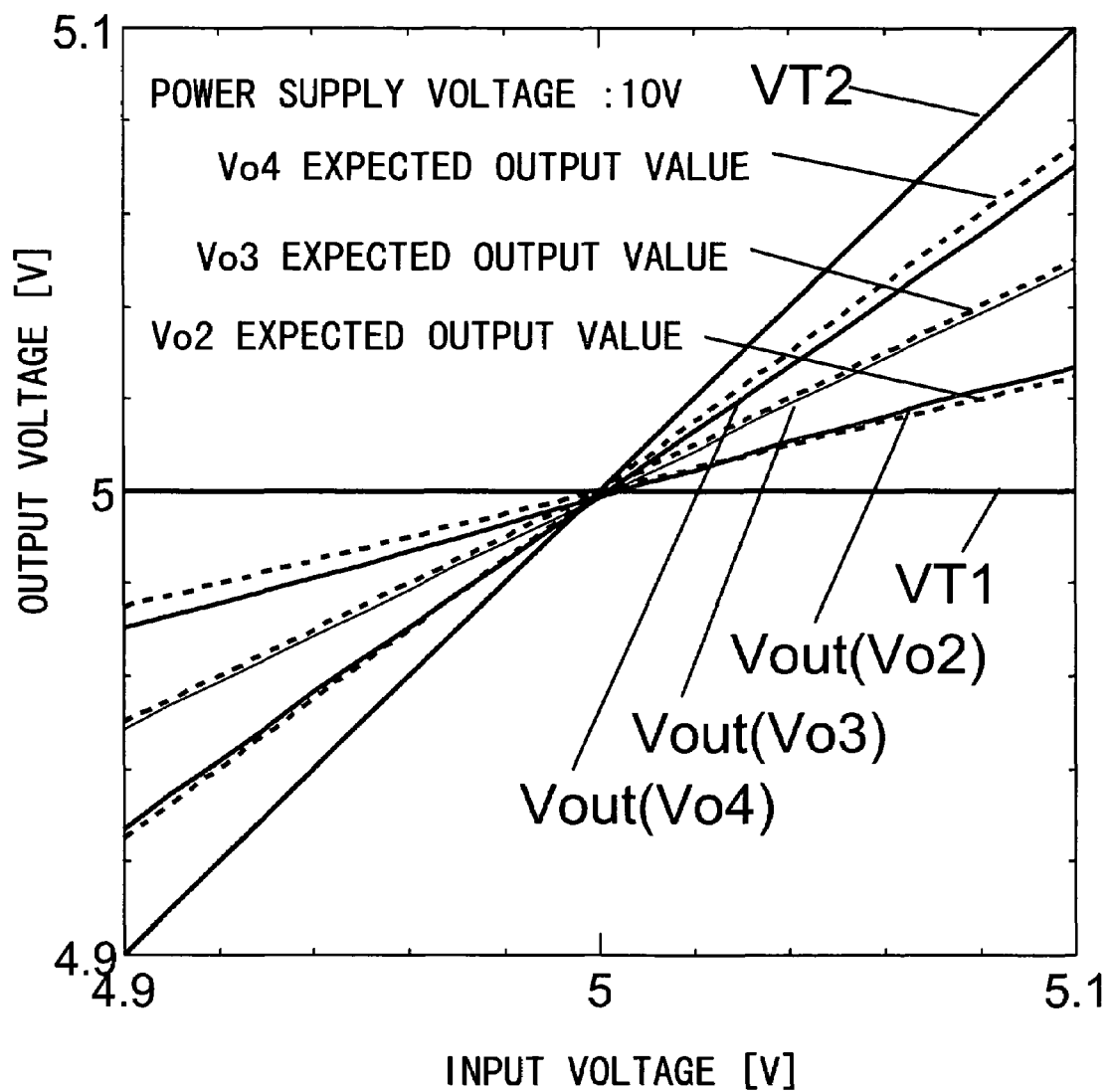
FIG. 13 a graph illustrating further input/output characteristics in the fourth operation of the differential amplifier of the present invention.

FIG. 13 shows the input/output characteristics resulting from the simulation in which the two differential pairs (101, 102) and (103, 104) of the differential amplifier of FIG. 10 are formed by transistors of the same characteristics and the current ratio of the currents I1 and I2 flowing through the respective differential pairs is changed to 1:3, 1:1 and to 3:1 under control by the current control circuit 7.

In FIG. 13, in case the current ratio of the currents I1 and I2 is changed to 3:1, 1:1 and to 1:3, the output voltage Vout becomes Vo2, Vo3 and Vo4, respectively. Also, the expected output values, when the voltages at the terminals T1 and T2 (VT1, VT2) are interiorly divided by 1:3, 1:1 and to 3:1, are denoted by broken lines labeled expected output value Vo2, expected output value Vo3 and expected output value Vo4, respectively.

It may be confirmed from FIG. 13 that the interior division ratio of the voltages VT1 and VT2 at the terminals T1 and T2 substantially corresponds to the reciprocal of the current ratio of the currents I1 and I2, such that the output voltage Vout substantially coincides with the output expected values (indicated by broken lines) within a range of ±0.1V. As for the voltage range exceeding ±0.1V, the output voltages Vo2 and Vo4 are progressively deviated from the expected output value Vo2 and from the expected output value Vo4, respectively, however, the output voltage Vo3, with the current ratio of the currents I1 and I2 equal to 1:1, is coincident fairly well to the expected output value Vo3, over a wide voltage range, as in FIG. 11.

In FIGS. 12 and 13, there are shown cases where the ratio of interior division of the voltages VT1 and VT2 by the output voltage Vout substantially coincides with the reciprocal of the current ratio of the currents I1 and I2. This relationship may need the proper settings of the transistor characteristics and the current ratio of the currents I1 and I2.

From FIGS. 12 and 13, it has been shown that, with the differential amplifier of the first embodiment of the present invention, it is possible to output plural voltage levels, interiorly dividing the two voltages, supplied to the terminals T1 and T2. It has also been shown that plural voltage levels, including the same level as the input voltage level, can be linearly output. The DAC of the third embodiment of the present invention, employing the differential amplifier of the first embodiment of the present invention, may also yield comparable results.

Figure 14:
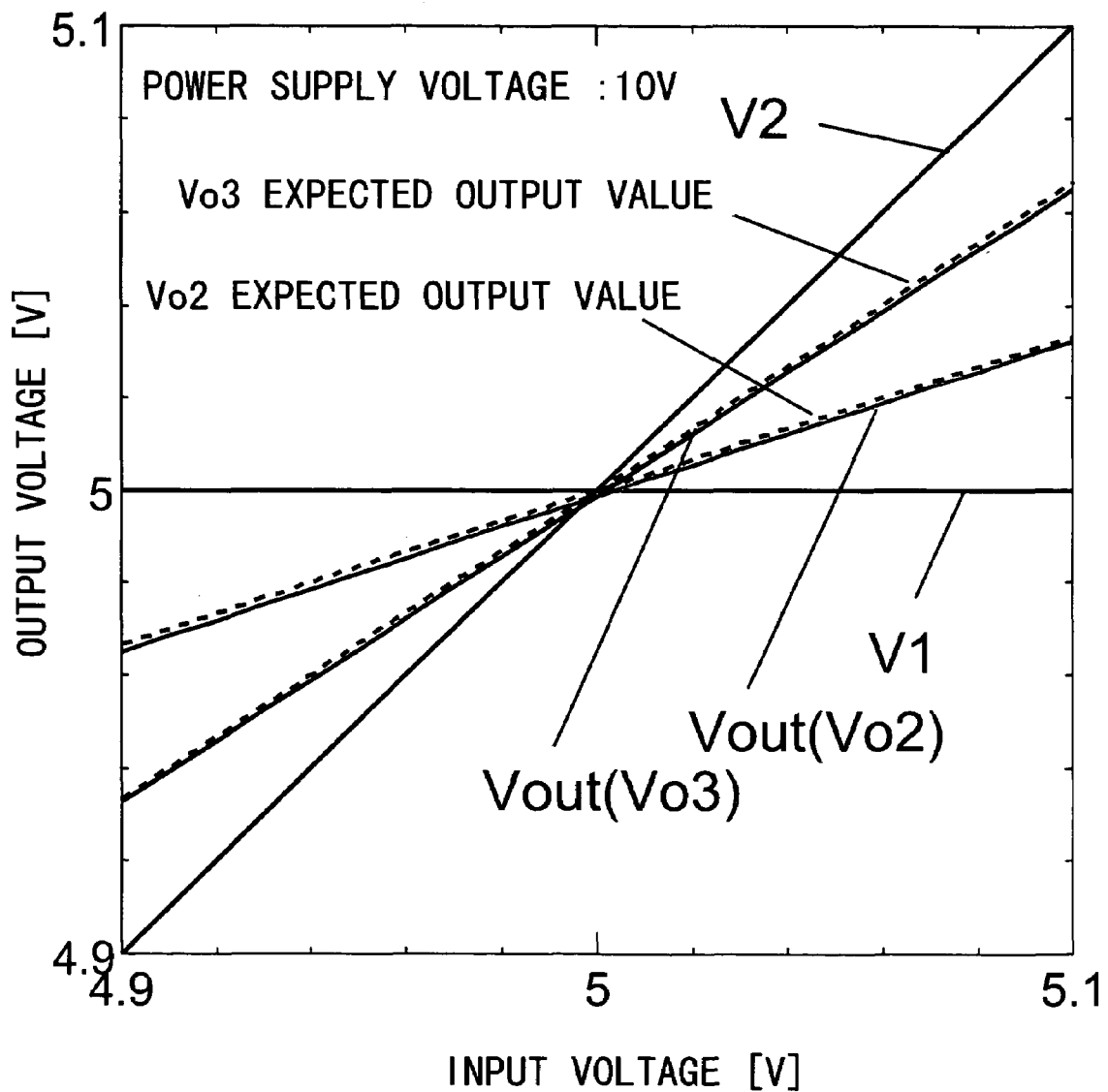
FIG. 14 a graph illustrating input/output characteristics in a fifth operation of the differential amplifier of the present invention.

FIG. 14 shows input/output characteristics resulting from the simulation in which an amplifier stage 6 similar to one shown in FIG. 10 is used in the differential amplifier of the second embodiment of the present invention shown in FIG. 2. Specifically, FIG. 14 shows input/output characteristics under the condition that the transistor size W/L of the differential pair (101, 102) is set to a value twice that of the differential pair (103, 104), the current ratio of the currents I1 and I2 flowing through the differential pairs is set to unity (I1=I2) and that the input to the terminals T1 and T2 of the two supply voltages V1 and V2 is controlled by the input control circuit 8.

If, in FIG. 14, the voltages output to the terminals (T1, T2) is switched from (V1, V2) to (V2, V1), the output voltage Vout becomes Vo2 and Vo3, respectively. The expected output values, interiorly dividing the voltages (V1, V2) by 1:2 and 2:1 are denoted by broken lines labeled expected output value Vo2 and expected output value Vo3, respectively.

It may be conformed from FIG. 14 that the output voltage Vout roughly coincides with the expected output value (broken line) within a range of ±0.1V. Meanwhile, in a voltage range exceeding ±0.1 V, the output voltage Vout is gently deviated from the expected output value. It has been shown from FIG. 14 that the differential amplifier of the second embodiment of the present invention is able to output plural voltage levels, interiorly dividing the two voltages, input to the terminals T1 and T2, as well as to output plural linear voltage levels including the same level as the input two voltage levels.

As may be seen from the above four results of simulation, it is possible with the differential amplifier of the present embodiment to output a voltage which divides the two voltages output to the terminals T1 and T2 into plural voltages and, in particular, for a voltage range with a relatively small voltage difference, for example, the voltage difference on the order of 0.1V, it is possible to output plural divided voltages to a high accuracy.

Figure 20:
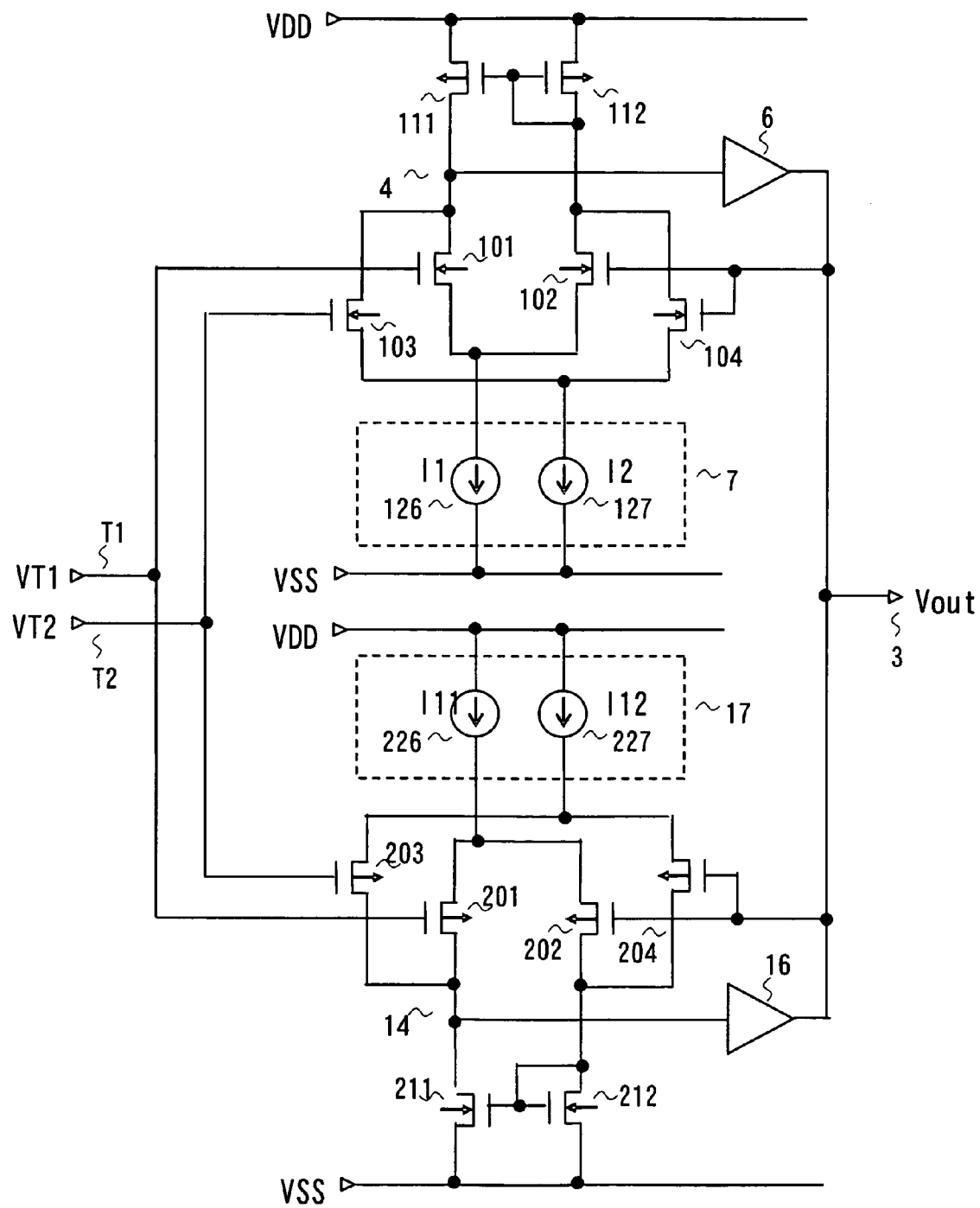
FIG. 20 is a diagram illustrating the configuration of a differential amplifier according to a fifth embodiment of the present invention.

FIG. 20 shows an arrangement of a differential amplifier according to a fifth embodiment of the present invention. In the embodiments shown in FIGS. 1 and 6, the differential amplifier is provided with the two differential pairs (101, 102) and (103, 104) having the same conductivity type. However, the differential amplifier is provided with two sets of the two differential pairs, the respective set being different in conductivity type each other. The differential amplifier of FIG. 20 is of the configuration in which there are provided two differential pairs of the same conductivity type and two other differential pairs of the same conductivity type different from that of the first-stated differential pairs, and is superior to the differential amplifier of, for example FIG. 1, in enlarging the dynamic range and in improving linearity. Referring to FIG. 20, the differential amplifier includes an n-channel differential pair (101, 102), which is driven by a current source 126 which is connected to the low potential power supply VSS, an n-channel differential pair (103, 104), which is driven by a current source 127, which is connected to the low potential power supply VSS, a current mirror circuit (p-channel transistors 111 and 112), which is connected between output pairs of the two n-channel differential pairs and a high potential power supply VDD and composes a common active load for the output pairs of the two n-channel differential pairs, and an amplifier circuit 6, which is supplied with an output signal of the current mirror circuit to output a voltage at an output terminal 3. In FIG. 20, the groups of switches SW1a, SW1b to SW4a, SW4b of FIG. 1 are not shown for convenience. However, the current control circuit 7 for controlling the current sources 126 and 127, adapted for providing the currents I1 and I2 to the two N-channel differential pairs (101, 102), (103, 104), is of the same configuration as that shown in FIG. 1.

The differential amplifier also includes a p-channel differential pair (201, 202) which is driven by a current source 226 which is connected to the high potential power supply VDD, a p-channel differential pair (203, 204) which is driven by a current source 227 which is connected to the high potential power supply VDD, a current mirror circuit (n-channel transistors 211, 212) which is connected between the output pairs of the two p-channel differential pairs and the low potential power supply VSS, and composes a common active load for the output pairs of the two p-channel differential pairs, and an amplifier circuit 16, which is supplied with an output signal of the current mirror circuit to output a voltage at the output terminal 3. A current control circuit 17 for controlling the current sources (226, 227), which is adapted for supplying the currents I11 and I12 to the two P-channel differential pairs (201, 202), (203, 204), is similar in configuration to the current control circuit 7, although it is not shown for simplifying the drawings. As for the input terminals (gate terminals) of the respective differential pairs, the gates of the transistors 101, 201 are connected in common to the input terminal T1, the gates of the transistors 103 and 203 are connected in common to the input terminal T2, and the gates of the transistors 102 and 104, and the gates of the transistors 202 and 204 are connected in common to the output terminal 3. The terminal voltages at the terminals T1 and T2 are designated as VT1 and VT2, respectively.

With the differential amplifier of FIG. 20, an output voltage, interiorly dividing the two voltages (VT1, VT2) at an optional ratio, may similarly be taken out by the current control circuits 7 and 17. In the embodiments of FIGS. 2 and 7, the differential amplifier is provided with two sets of the two differential pairs, and the two transistors of each set of the differential pairs may be of the different conductivity types. The differential amplifier of FIG. 20 may, of course, be designed so that the current sources 126 and 127, and the current sources 226 and 227 are set to respective preset current values, the input control circuit 8 is provided to the terminals T1 and T2 or that there is further provided a resistor string similar to that shown in FIG. 7 and a set of switches S1a to Snb of FIG. 7.

In the embodiments shown in FIGS. 1, 2, 6 and 7, the signal at one node of a pair of connection nodes between the output pairs of the two differential pairs (101, 102) and (103, 104) and the load circuit (111, 112) is supplied to the amplifier stage 6. Alternatively, it is also possible to construct the amplifier stage 6 by a differential amplifier stage and a pair of connection nodes between the output pairs of the two differential pairs (101, 102) and (103, 104) and the load circuit (111, 112) may differentially be connected to the inputs of an input pair of the amplifier stage. In the embodiments shown in FIGS. 1, 2, 6 and 7, the load circuits 111, 112 are used in common by the two differential pairs (101, 102) and (103, 104). However, distinct load circuits may, of course, be provided for these differential pairs.

Although the present invention has so far been described with reference to specified embodiments thereof, the present invention is not limited to these embodiments and a variety of changes or corrections that may readily occur to those skilled in the art may naturally be attempted without departing from the scope of the invention as defined in the claims.

The differential amplifier, described in the above embodiments, is formed by MOS transistors. In a driving circuit for a liquid crystal display apparatus, a MOS transistor of polycrystalline silicon (TFT) may be used. Although the above embodiments are directed to the integrated circuit, discrete device structures may, of course, be used within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:
   first and second input terminals;
   an output terminal;
   first and second differential pairs;
   first and second current sources for supplying currents to said first and second differential pairs, respectively;
   said first differential pair having first and second inputs constituting an input pair thereof connected to said first input terminal and said output terminal, respectively;
   said second differential pair having first and second inputs constituting an input pair thereof connected to said second input terminal and said output terminal, respectively;
   a load circuit connected to output pairs of said first and second differential pairs, for outputting a signal obtained on combining outputs of said first and second differential pairs from at least one of respective connection node between the output pairs of said first and second differential pairs and said load circuit;
   an amplifier stage for receiving at least one signal at a connection node between said output pairs of said first and second differential pairs and said load circuit and outputting a voltage at said output terminal; and
   a current control circuit for controlling said first and second current sources to control the ratio of currents supplied to said first and second differential pairs, respectively.

2. The differential amplifier according to claim 1, wherein said load circuit is composed by a current mirror circuit.

3. The differential amplifier according to claim 1, further comprising:
first and second voltage supply terminals for receiving preset voltages; and
an input control circuit for controlling the connection between said first and second voltage supply terminals and said first and second input terminals.

4. The differential amplifier according to claim 1, wherein said first and second current sources each including a transistor;
said current control circuit for selecting a bias voltage, out of a plurality of bias voltages received, based on an input control signal, and supplying the selected bias voltage to control terminals of said transistors constituting said first and second current sources to control the ratio of the currents to be supplied to said first and second differential pairs, respectively.

5. The differential amplifier according to claim 1, wherein said current control circuit controls said first and second current sources so that the sum of the currents supplied to said first and second differential pairs is kept constant.

6. The differential amplifier according to claim 1, wherein
the transistor pairs of said first and second differential pairs are of the same size; and
the ratio of the currents through said first and second differential pairs is adjusted;
a voltage corresponding to one of levels which divide the potential difference between said first and second input terminals by three being output from said output terminal.

7. The differential amplifier according to claim 1, wherein
the currents of said first and second current sources differ from each other; and
first and second voltages are applied to said first and second input terminals, respectively; wherein
a first voltage level, corresponding to said first voltage, is output from said output terminal, under interruption of the current of said second current source;
a second voltage level, corresponding to one of voltage levels which divide the potential difference between said first and second voltages by three, is output from said output terminal, with the current of said first current source being larger than the current of said second current source;
a third voltage level, corresponding to the other of voltage levels which divide the potential difference between said first and second voltages by three, is output from said output terminal, with the current of said second current source being larger than the current of said first current source; and
a fourth voltage level, corresponding to said second voltage, is output from said output terminal, under interruption of the current of said first current source.

8. The differential amplifier according to claim 1, further comprising:
third and fourth differential pairs, the conductivity type of which is different from that of said first and second differential pairs, said third and fourth differential pairs having first inputs constituting respective input pairs thereof connected to said first and second input terminals, respectively and having second inputs constituting the respective input pairs thereof connected to said output terminal;
third and fourth current sources for supplying the current to said third and fourth differential pairs, respectively;
a further load circuit connected to output pairs of said third and fourth differential pairs;
at least one output of an output pair of said third differential pair and one output of an output pair of said fourth differential pair being connected in common;
a further amplifier stage having an input terminal connected to a common connection node between one output of an output pair of the third differential pair and one output of an output pair of the fourth differential pair and having an output terminal connected to said output terminal; and
a further current control circuit for controlling said third and fourth current sources to control the ratio of currents supplied to said third and fourth differential pairs.

9. The differential amplifier according to claim 1, wherein
said amplifier stage includes a transistor connected between a power supply and sand output terminal and adapted for charging/discharging said output terminal.

10. The differential amplifier according to claim 8, wherein
at least one of said amplifier stage and said further amplifier stage includes a transistor connected between a power supply and sand output terminal and adapted for charging/discharging said output terminal.

11. A digital-to-analog converter comprising:
a resistor string connected between said first voltage supply terminal and a second voltage supply terminal and outputting a plurality of voltage levels different from one another from respective taps thereof; and
a switching circuit for selectively outputting two voltages, based on input data, from among a plurality of voltage levels, different from one another, output from respective taps of said resistor string; and
a differential amplifier as defined in claim 1, as an amplifier circuit supplied with the two voltages output from said switch circuit and outputting a voltage relating to said input data.

* * * * *